(12) United States Patent
Yoshida

(10) Patent No.: US 11,209,706 B2
(45) Date of Patent: Dec. 28, 2021

(54) SUBSTRATE FOR DISPLAY DEVICE AND DISPLAY DEVICE

(71) Applicant: Sharp Kabushiki Kaisha, Osaka (JP)

(72) Inventor: Masahiro Yoshida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 44 days.

(21) Appl. No.: 16/911,436

(22) Filed: Jun. 25, 2020

(65) Prior Publication Data

US 2021/0003895 A1    Jan. 7, 2021

Related U.S. Application Data

(60) Provisional application No. 62/869,087, filed on Jul. 1, 2019.

(51) Int. Cl.
*G02F 1/1362* (2006.01)
*G02F 1/1339* (2006.01)
*H01L 27/32* (2006.01)

(52) U.S. Cl.
CPC ...... *G02F 1/136286* (2013.01); *G02F 1/1339* (2013.01); *G02F 1/136213* (2013.01); *H01L 27/3276* (2013.01)

(58) Field of Classification Search
CPC .. G02F 1/1339; G02F 1/1345; G02F 1/13454; G02F 1/136213; G02F 1/136286; H01L 27/124; H01L 27/3276
See application file for complete search history.

(56) References Cited

U.S. PATENT DOCUMENTS 10,852,591 B2 * 12/2020 Yoshida .............. G02F 1/13454
2009/0251656 A1 * 10/2009 Shin .................. G02F 1/133345
349/158

FOREIGN PATENT DOCUMENTS

JP         07-325317 A    12/1995

* cited by examiner

*Primary Examiner* — Afroza Chowdhury
(74) *Attorney, Agent, or Firm* — Keating & Bennett, LLP

(57) ABSTRACT

To, while keeping a narrow frame, increase a time constant pertaining to the transmission characteristics of a signal.
A substrate 10A for a display device includes a display area AA capable of displaying an image, a signal supply circuit section 15, disposed closer to an end than the display area AA, that has a circuit element including at least a first conducting film 20 and a second conducting film 23 with an insulating layer 21 sandwiched between the first conducting film 20 and the second conducting film 23, a display line 13 disposed in the display area AA, composed of the first conducting film 20, and supplied with a signal by the signal supply circuit section 15, and a connecting line 30 connected to the display line 13 and the signal supply circuit section 15. At least a portion of the connecting line 30 is constituted by a third conducting film 29 with insulating films 21, 24, 25, and 27 sandwiched between the first conducting film 20 and the third conducting film 29 and with the insulating films 24, 25, and 27 sandwiched between the second conducting film 23 and the third conducting film 29.

15 Claims, 22 Drawing Sheets

SUBSTRATE FOR DISPLAY DEVICE AND DISPLAY DEVICE

TECHNICAL FIELD

The present invention relates to a substrate for a display device and a display device.

BACKGROUND ART

Conventionally, a liquid crystal display device described in PTL 1, which is listed below, has been known as an example of a liquid crystal display device. The liquid crystal display device described in PTL 1 is structured such that a lead wire leading a scanning signal line from a panel display picture element section of a liquid crystal panel to a connection terminal section to which a scan driver for the panel display picture element section is connected has, as a portion thereof, a wire routing portion that allows the transmission characteristics of a scanning signal from the scan driver to have a larger time constant.

CITATION LIST

Patent Literature

[PTL 1] Japanese Unexamined Patent Application Publication No. 7-325317

Technical Problem

According to the liquid crystal display device described in PTL 1, which is listed above, the time it takes for a scanning signal to fall increases uniformly for all picture elements of the panel display picture element section. This makes it possible to reduce unevenness on a screen that occurs due to variations in the time required for a scanning signal to fall within the panel display picture element section. However, since the wire routing portion described in PTL 1 is disposed in a limited area between the connection terminal section to which the scan driver is connected and the panel display picture element section, there has been a limit to the extent to which the wire length of a lead wire is increased. For a further increase in the wire length of a lead wire, it is only necessary to widen the area between the connection terminal section and the panel display picture element section. However, doing so undesirably results in a wider frame width.

SUMMARY OF INVENTION

The present invention was made under such circumstances and has as an object to, while keeping a narrow frame, increase a time constant pertaining to the transmission characteristics of a signal.

Solution to Problem (1) One embodiment of the present invention is directed to a substrate for a display device, the substrate including: a display area capable of displaying an image; a signal supply circuit section, disposed closer to an end than the display area, that has a circuit element including at least a first conducting film and a second conducting film with an insulating layer sandwiched between the first conducting film and the second conducting film; a display line disposed in the display area, composed of the first conducting film or the second conducting film, and supplied with a signal by the signal supply circuit section; and a connecting line connected to the display line and the signal supply circuit section, wherein at least a portion of the connecting line is constituted by a third conducting film with insulating films sandwiched between the first conducting film and the third conducting film and between the second conducting film and the third conducting film.

(2) Further, an embodiment of the present invention is directed to the substrate according to the configuration (1) described above, wherein the connecting line is connected to the signal supply circuit section in a place located at a side of an end of the signal supply circuit section that faces the display area opposite to the display area.

(3) Further, an embodiment of the present invention is directed to the substrate according to the configuration (2) described above, wherein the signal supply circuit section includes an output transistor that outputs the signal as the circuit element, and a signal outputter, connected to the output transistor and the connecting line, that transmits to the connecting line the signal outputted from the output transistor, and the connecting line is connected to the signal outputter in a place located at a side of the output transistor opposite to the display area, and is disposed so as to pass transversely across the output transistor.

(4) Further, an embodiment of the present invention is directed to the substrate according to the configuration (3) described above, wherein the signal supply circuit section includes a capacitance former disposed as the circuit element at a side of the output transistor opposite to the display area, the capacitance former has a first electrode and a second electrode that overlap each other via an insulating film, the output transistor has a gate electrode connected to either of the first electrode and the second electrode, the signal outputter is connected to the other of the first electrode and the second electrode, and the connecting line is connected to the signal outputter in a place located at a side of the capacitance former opposite to the output transistor, and is disposed so as to pass transversely across the capacitance former.

(5) Further, an embodiment of the present invention is directed to the substrate according to the configuration (4) described above, wherein the signal supply circuit section includes a control transistor disposed as the circuit element at a side of the capacitance former opposite to the output transistor, and the connecting line is connected to the signal outputter in a place located at a side of the control transistor opposite to the display area, and is disposed so as to pass transversely across the control transistor.

(6) Further, an embodiment of the present invention is directed to the substrate according to the configuration (5) described above, wherein the signal outputter includes an output line connected to at least the capacitance former and the control transistor and composed of the first conducting film or the second conducting film, and the connecting line is connected to the output line and disposed so as to overlap the output line.

(7) Further, an embodiment of the present invention is directed to the substrate according to the configuration (3) described above, wherein the signal supply circuit section includes a capacitance former as the circuit element, the capacitance former has a first electrode and a second electrode that overlap each other via an insulating film, the output transistor has a gate electrode connected to either of the first electrode and the second electrode, the signal outputter is connected to the other of the first electrode and the second electrode, and the connecting line is connected to the signal outputter in such a place as to overlap a portion of the capacitance former.

(8) Further, an embodiment of the present invention is directed to the substrate according to any one of the configurations (2) to (7) described above, wherein a plurality of the display lines are arranged side by side in the display area along a cross direction crossing a direction of arrangement of the signal supply circuit section and the display area, the signal supply circuit section includes a plurality of unit circuit components each provided with the circuit element and arranged side by side along the cross direction, a plurality of the connecting lines are individually connected to the plurality of display lines and the plurality of unit circuit components, the plurality of unit circuit components each has a signal outputter, connected to the connecting line, that outputs the signal to the connecting line, at least a portion of the signal outputter extends along the cross direction so as to pass transversely across the unit circuit component adjacent in the cross direction, the connecting line is connected to the signal outputter in a place offset in the cross direction from the unit circuit component to which the connecting line is connected, and is disposed so as to pass transversely across the unit circuit component adjacent to the unit circuit component to which the connecting line is connected.

(9) Further, an embodiment of the present invention is directed to the substrate according to any one of the configurations (1) to (8) described above, wherein the display line is composed of the first conducting film, and the connecting line is constituted by a second conducting film constituent composed of the second conducting film and connected to the display line and a third conducting film constituent composed of the third conducting film and connected to the signal supply circuit section.

(10) Further, an embodiment of the present invention is directed to the substrate according to the configuration (9) described above, further including a line extended along a cross direction crossing a direction of arrangement of the signal supply circuit section and the display area, located between the display area and the signal supply circuit section, and composed of the third conducting film, wherein the connecting line is disposed so that the second conducting film constituent passes transversely across the line.

(11) Further, an embodiment of the present invention is directed to the substrate according to any one of the configurations (1) to (10) described above, wherein a plurality of the display lines are arranged side by side in the display area along a cross direction crossing a direction of arrangement of the signal supply circuit section and the display area, the signal supply circuit section includes a plurality of unit circuit components each provided with the circuit element and arranged side by side along the cross direction, a plurality of the connecting lines are individually connected to the plurality of display lines and the plurality of unit circuit components, and the connecting line is connected to the display line by extending so as to repeatedly meander within a range of the unit circuit component to which the connecting line is connected.

(12) Further, an embodiment of the present invention is directed to the substrate according to any one of the configurations (1) to (11) described above, wherein a plurality of the display lines are arranged side by side in the display area along a cross direction crossing a direction of arrangement of the signal supply circuit section and the display area, the signal supply circuit section includes a plurality of unit circuit components each provided with the circuit element and arranged side by side along the cross direction, a plurality of the connecting lines are individually connected to the plurality of display lines and the plurality of unit circuit components, the display area includes a first area whose outer shape has a side extending along the cross direction and a second area, located at an end of the first area in the cross-direction, that has an outer shape which is different from that of the first area, the signal supply circuit section is located closer to the first area than to the second area in the cross direction, and a plurality of the connecting lines include a first connecting line connected to the display line disposed in the first area and a second connecting line that is connected to the display line disposed in the second area and that is configured such that a place of connection of the second connecting line to the unit circuit component is closer to the display area than a place of connection of the first connecting line to the unit circuit component.

(13) Further, an embodiment of the present invention is directed to the substrate according to the configuration (12) described above, wherein the plurality of connecting lines are configured such that a creeping distance from an end of the unit circuit component that faces the display area to a place of connection of the connecting line to the unit circuit component is inversely correlated with a creeping distance from the end of the unit circuit component that faces the display area to the display line.

(14) Further, one embodiment of the present invention is directed to a display device including: the substrate according to any one of the configurations (1) to (13) described above; and a counter substrate placed opposite the substrate.

(15) Further, an embodiment of the present invention is directed to the display device according to the configuration (14) described above, further including: a liquid crystal layer sandwiched between the substrate and the counter substrate; and a seal sandwiched between the substrate and the counter substrate, disposed so as to surround the liquid crystal layer, and made of a photo-curing resin material, wherein at least a portion of the signal supply circuit section serves as a seal overlap portion disposed so as to overlap the seal, the overlap portion has a slit, bored therethrough, through which to transmit light, and the connecting line is disposed in such a manner as to circumvent the slit so as not to overlap the slit.

Advantageous Effects of Invention

The present invention makes it possible to, while keeping a narrow frame, increase a time constant pertaining to the transmission characteristics of a signal.

DESCRIPTION OF EMBODIMENTS

Embodiment 1

Figure 1:
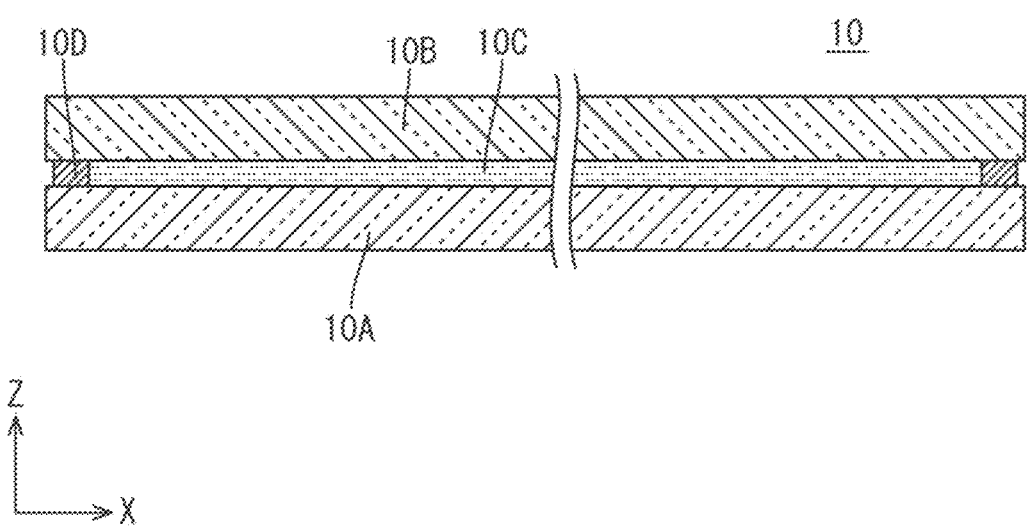
FIG. 1 is a schematic cross-sectional view of a liquid crystal panel according to Embodiment 1 of the present invention.

Embodiment 1 of the present invention is described with reference to FIGS. 1 to 12. The present embodiment illustrates a liquid crystal panel (display device) 10 and an array substrate (substrate for a display panel) 10A. Some of the drawings show an X axis, a Y axis, and a Z axis, and directions parallel to the axes are drawn to be directions shown in the drawings, respectively. Further, FIGS. 4, 10, 11, and 12 show front side up and back side down.

FIG. 1 is a schematic cross-sectional view of the liquid crystal panel 10. As shown in FIG. 1, the liquid crystal panel 10 includes an array substrate 10A, a CF substrate (counter substrate) 10B disposed so as to face the array substrate 10A, a liquid crystal layer 10C sandwiched between the two substrates 10A and 10B, and a seal 10D sandwiched between the two substrates 10A and 10B so as to surround and seal in the liquid crystal layer 10C. In the present embodiment, the seal 10D is made of an ultraviolet-curable resin material (photo-curable resin material). Accordingly, in the manufacture of the liquid crystal panel 10, the seal 10D is applied uncured to at least either of the pair of substrates 10A and 10B, which are then bonded together, and then the seal 10D is irradiated with light for curing through the array substrate 10A. Then, the seal 10D, which was uncured, acceleratedly becomes cured, whereby a space (liquid crystal layer 10C) between the pair of substrates 10A and 10B is sealed in. Further, alignment films configured to anchor liquid crystal molecules contained in the liquid crystal layer 10C are formed on inner surfaces of the two substrates 10A and 10B that face the liquid crystal layer 10C, respectively. Further, polarizing plates are bonded to outer surfaces of the two substrates 10A and 10B, respectively.

Figure 2:
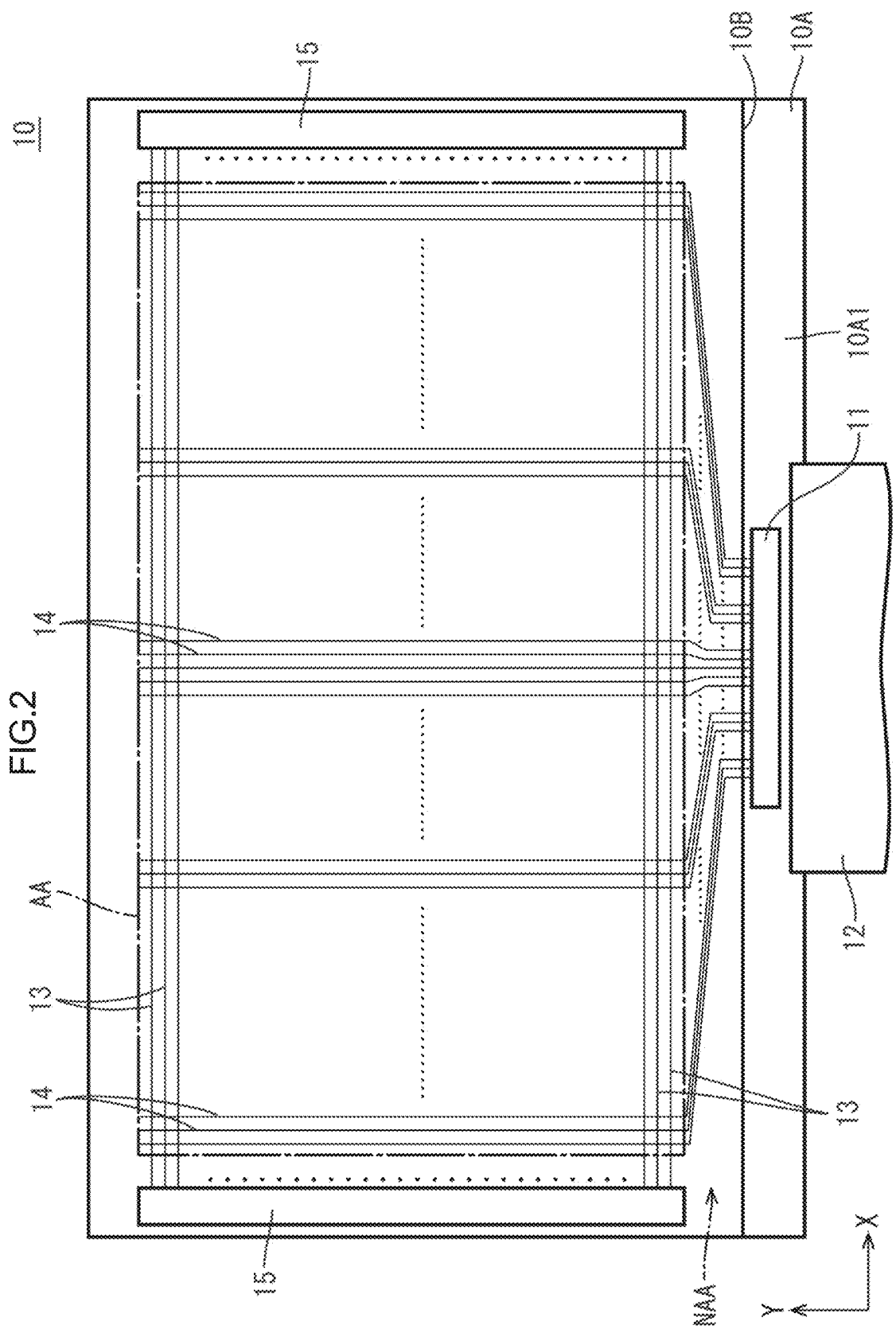
FIG. 2 is a schematic plan view of the liquid crystal panel.

FIG. 2 is a plan view of the liquid crystal panel 10.

As shown in FIG. 2, the liquid crystal panel 10 has a horizontally long square shape as a whole, has a long-side direction parallel to an X-axis direction of the drawings, and has a short-side direction parallel to a Y-axis direction of the drawings. In the liquid crystal panel 10, a short-side dimension of the CF substrate 10B is shorter than a short-side dimension of the array substrate 10A, while the CF substrate 10B is bonded to the array substrate 10A in such a manner that an end of the CF substrate 10B in the short-side direction (Y-axis direction) meets an end of the array substrate 10A in the short-side direction (Y-axis direction). Accordingly, the other end of the array substrate 10A in the short-side direction serves as a CF substrate non-overlap portion 10A1 that projects toward a side with respect to the CF substrate 10B and that does not overlap the CF substrate 10B. This CF substrate non-overlap portion 10A1 is mounted with a driver 11 and a flexible substrate 12. The driver 11 is composed of an LSI chip having a drive circuit inside, is mounted on the CF substrate non-overlap portion 10A1 by COG (chip on glass), and processes various types of signal supplied by the flexible substrate 12. In the present embodiment, only one driver 11 is mounted on the array substrate 10A. The flexible substrate 12 includes a substrate made of a synthetic resin material (such as polyimide resin) having insulation properties and flexibility and a large number of wiring patterns formed over the substrate. The flexible substrate has its first end connected to the CF substrate non-overlap portion 10A1 of the array substrate 10A and has its second end connected to a control substrate (signal supply source). Various types of signal supplied from the control substrate are transmitted via the flexible substrate 12 to and processed by the driver 11 of the liquid crystal panel 10. In the present embodiment, only one flexible substrate 12 is mounted in a substantially middle position on the CF substrate non-overlap portion 10A1 in the long-side direction (X-axis direction).

As shown in FIG. 2, the liquid crystal panel 10 has a screen whose central portion serves as a display area (wiring area) AA. The display area AA is an area surrounded by dot-and-dash lines in FIG. 2. In the display area AA, a plurality of gate lines (display lines, scanning lines) 13 extending along the X-axis direction and a plurality of source lines (image lines, data lines) 14 extending along the Y-axis direction are disposed so as to form a gridlike shape as a whole. The screen of the liquid crystal panel 10 has an outer peripheral portion surrounding the display area AA and serving as a non-display area NAA in which no image is displayed. The non-display area NAA is provided with a gate circuit section (signal supply circuit section) 15 configured to supply scanning signals to the gate lines 13 disposed in the display area AA. A pair of the gate circuit sections 15 are disposed in such a manner that the display area AA is interposed with the gate circuit sections 15 located at both ends, respectively, of the display area AA in the X-axis direction. The gate circuit section 15 and the display area AA are arranged in a direction of arrangement parallel to the X-axis direction of the drawings. The gate circuit section 15 has a band shape extending along the Y-axis direction (cross direction) orthogonal (crossing) the X-axis direction, which is the aforementioned direction of arrangement, and is monolithically provided on the array substrate 10A. A configuration of this gate circuit section 15 will be described in detail later. Further, the non-display area NAA includes a mounting area (CF substrate non-overlap portion 10A1) in which the aforementioned driver 11 and the aforementioned flexible substrate 12 are mounted. The source lines 14 disposed in the display area AA are connected to the driver 11 and supplied with image signals from the driver 11.

Figure 3:
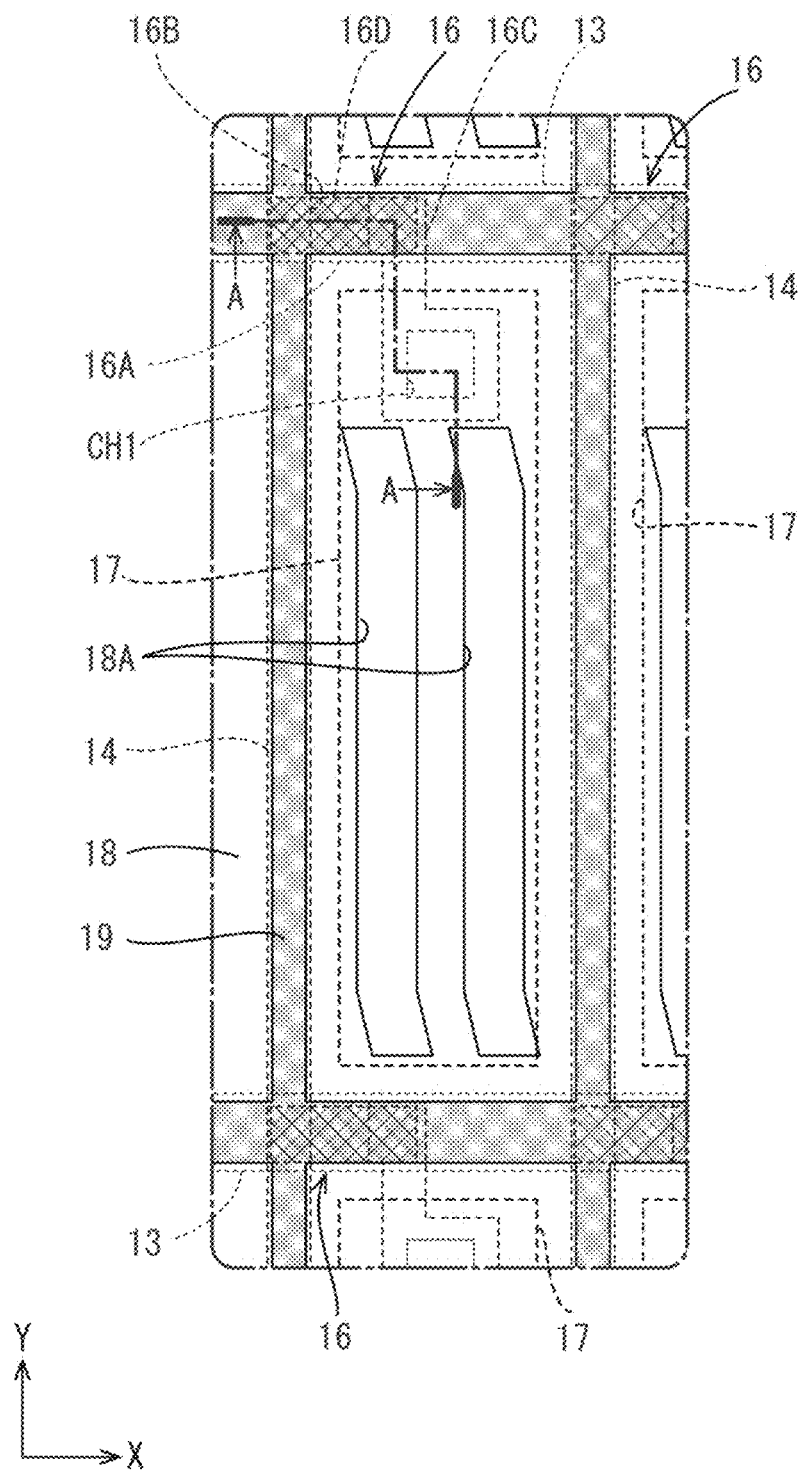
FIG. 3 is a plan view showing a pixel array over an array substrate constituting the liquid crystal panel.

FIG. 3 is a plan view in the display area AA of the array substrate 10A constituting the liquid crystal panel 10. FIG. 3 applies half-tone dot meshing to a semiconductor film 22 and a third metal film 29, which will be described later. As shown in FIG. 3, a pixel transistor 16 and a pixel electrode 17 are provided over an inner surface of the array substrate 10A in the display area AA. A plurality of the pixel transistors 16 and a plurality of the pixel electrodes 17 are arrayed in a matrix (i.e. in rows and columns) by being arranged at spacings along the X-axis direction and the Y-axis direction. Around this pixel transistor 16 and this pixel electrode 17, a gate line 13 and a source line 14 that are substantially orthogonal to (cross) each other are placed. The gate line 13 and the source line 14 are connected to a gate electrode 16A and a source electrode 16B, respectively, of the pixel transistor 16, and the pixel electrode 17 is connected to a drain electrode 16C of the pixel transistor 16. Moreover, when driven on the basis of a scanning signal supplied to the gate line 13, the pixel transistor 16 supplies an image signal supplied to the source line 14 from the source electrode 16B to the drain electrode 16C via a channel (semiconductor part) 16D, whereby the pixel electrode 17 can be charged to an electric potential based on the image signal.

As shown in FIG. 3, the pixel electrode 17 has a vertically long substantially square shape in plan view, has a short-side direction parallel to a direction of extension of the gate line 13, and has a long-side direction parallel to a direction of extension of the source line 14. The pixel electrode 17 has a short-side dimension of, for example, approximately 20 μm and has a long-side dimension of, for example, approximately 60 μm. A common electrode 18 that is substantially solid in such a manner as to overlap the pixel electrode 17 is formed at a higher level than the pixel electrode 17 over the array substrate 10A. Connected to the common electrode 18 is a common line 19 through which to supply a common potential signal (reference potential signal) to the common electrode 18. The common line 19 is disposed so as to overlap both the gate line 13 and the source line 14, and has a gridlike shape as a whole. A portion of the common electrode 18 that overlaps the pixel electrode 17 has bored therethrough a plurality of pixel electrode overlap openings 18A extending along the long-side direction of the pixel electrode 17. Upon emergence of a potential difference between the pixel electrode 17 and the common electrode 18, which overlap each other, a fringe field (oblique field) containing a component normal to a board surface of the array substrate 10A in addition to a component parallel to the board surface of the array substrate 10A is produced between the pixel electrode 17 and opening edges of the pixel electrode overlap openings 18A of the common electrode 18. Accordingly, utilizing this fringe field makes it possible to control an alignment state of the liquid crystal molecules contained in the liquid crystal layer 10C. That is, the liquid crystal panel 10 according to the present embodiment is in an operation mode called "FFS (fringe field switching) mode". Further, the CF substrate 10B is provided with a large number of color filters arranged in a matrix in such places in the display area AA as to face the pixel electrodes 17 provided over the array substrate 10A. The color filters include color filters of three colors, namely R (red), G (green), and B (blue), repeatedly arranged side by side in a predetermined order, and constitute pixels together with the pixel electrodes 17. Further, a light-shielding film (black matrix) for preventing a mixture of colors is formed between one color filter and another.

Figure 4:
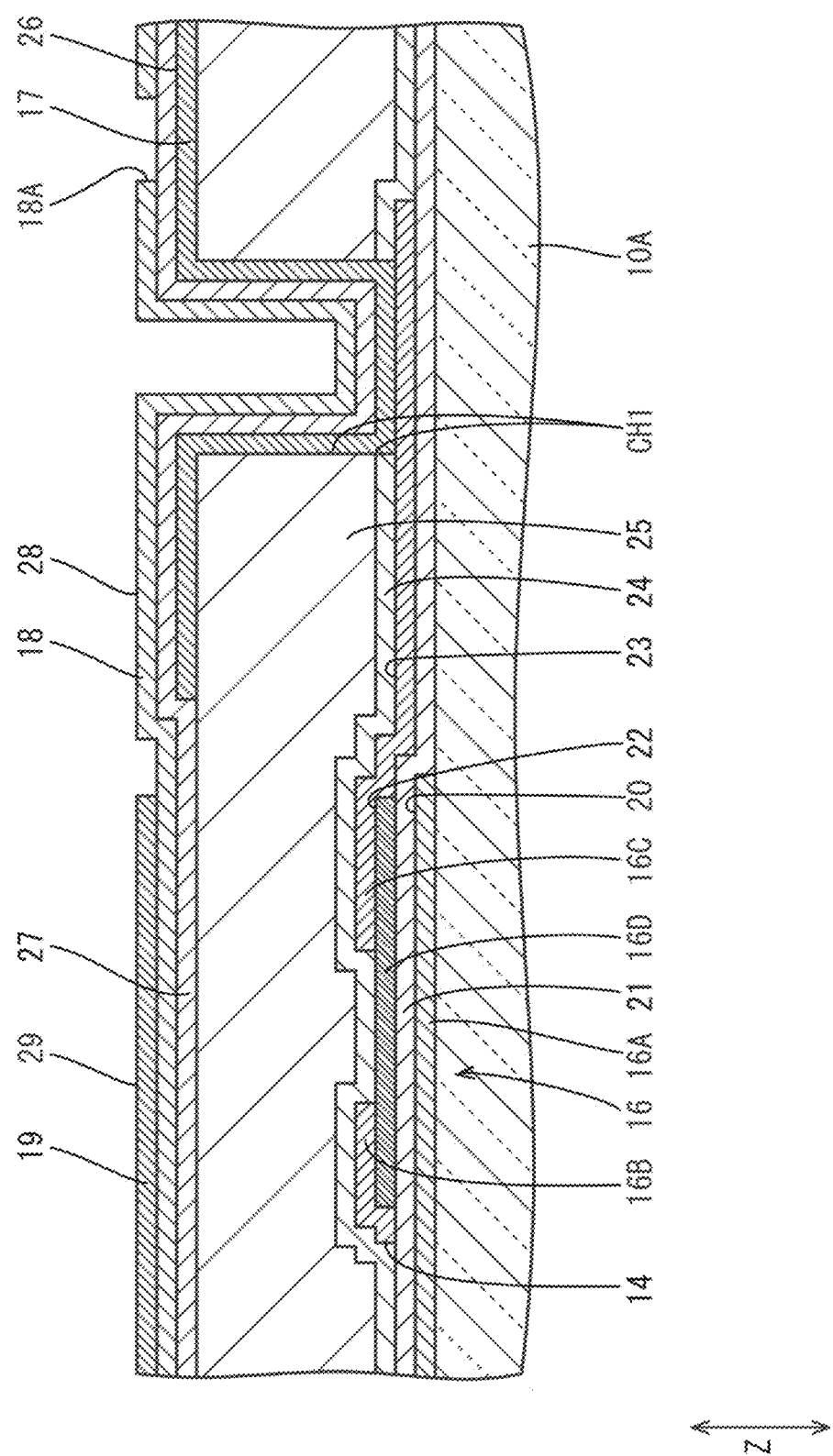
FIG. 4 is a cross-sectional view of the array substrate as taken along line A-A in FIG. 3.

Various types of film stacked over the inner surface of the array substrate 10A are described here with reference to FIG. 4. FIG. 4 is a cross-sectional view of the pixel transistor 16 and its surroundings in the liquid crystal panel 10. Over the array substrate 10A, as shown in FIG. 4, a first metal film (first conducting film) 20, a gate insulating film (insulating film) 21, a semiconductor film 22, a second metal film (second conducting film) 23, a first interlayer insulating film 24, a planarizing film 25, a first transparent electrode film 26, a second interlayer insulating film (inter-electrode insulating film) 27, a second transparent electrode film 28, and a third metal film (third conducting film) 29 are stacked in this order from a lower level (i.e. from a glass substrate). The first metal film 20, the second metal film 23, and the third metal film 29 each possess electrical conductivity and a light blocking effect by being composed of a single layer film made of one type of metal material selected from among copper, titanium, aluminum, molybdenum, tungsten, and the like, a laminated film made of different types of metal material, or an alloy. The first metal film 20 constitutes the gate line 13, the gate electrode 16A of the pixel transistor 16, and the like. The second metal film 23 constitutes the source line 14, the source electrode 16B and drain electrode 16C of the pixel transistor 16, and the like. The third metal film 29 constitutes the common line 19 and the like. The semiconductor film 22 is composed of a thin film made of a semiconductor material such as an oxide semiconductor or amorphous silicon, and constitutes the channel 16D of the pixel transistor 16 and the like. Using an oxide semiconductor as the semiconductor material of the semiconductor film 22 makes the channel 16D high in mobility and is therefore suitable to achieving a reduction in size of the pixel transistor 16 and the like. The first transparent electrode film 26 and the second transparent electrode film 28 are made of a transparent electrode material (such as ITO (indium tin oxide) or IZO (indium zinc oxide)). The first transparent electrode film 26 constitutes the pixel electrode 17 and the like. The first transparent electrode film 26 is disposed at a higher level than the first interlayer insulating film 24. The second transparent electrode film 28 constitutes the common electrode 18 and the like. On the second transparent electrode film 28, the third metal film 29 is stacked directly without an insulating film interposed at a higher level than the second transparent electrode film 28; therefore, the common line 19, which is composed of the third metal film 29, is connected to the common electrode 18, which is composed of the second transparent electrode film 28, over substantially the entire area of the common line 19.

As shown in FIG. 4, the gate insulating film 21, the first interlayer insulating film 24, and the second interlayer insulating film 27 are each made of an inorganic material such as silicon nitride ($SiN_x$) or silicon oxide ($SiO_2$). The planarizing film 25 is made of an organic insulating material (organic material) such as PMMA (acrylic resin), and is larger in film thickness than other insulating films 21, 24, and 27 each made of an organic material. This planarizing film 25 allows the array substrate 10A to have a planarized surface. The gate insulating film 21 keeps the first metal film 20, which is located at a lower level than the gate insulating film 21, insulated from the semiconductor film 22 and the second metal film 23, which are located at a higher level than the gate insulating film 21. Accordingly, the gate insulating film 21 insulates an intersection between the gate line 13, which is composed of the first metal film 20, and the source line 14, which is composed of the second metal film 23. The first interlayer insulating film 24 and the planarizing film 25 keep the semiconductor film 22 and the second metal film 23, which are located at a lower level than the first interlayer insulating film 24 and the planarizing film 25, insulated from the first transparent electrode film 26, which is located at a higher level than the first interlayer insulating film 24 and the planarizing film 25. The first interlayer insulating film 24 and the planarizing film 25 have a contact hole CH1, bored therethrough in such a place as to overlap both the drain electrode 16C of the pixel transistor 16 and the pixel electrode 17, through which the drain electrode 16C of the pixel transistor 16 and the pixel electrode 17 are connected. The second interlayer insulating film 27 keeps the first transparent electrode film 26, which is located at a lower level than the second interlayer insulating film 27, insulated from the second transparent electrode film 28, which is located at a higher level than second interlayer insulating film 27.

Figure 5:
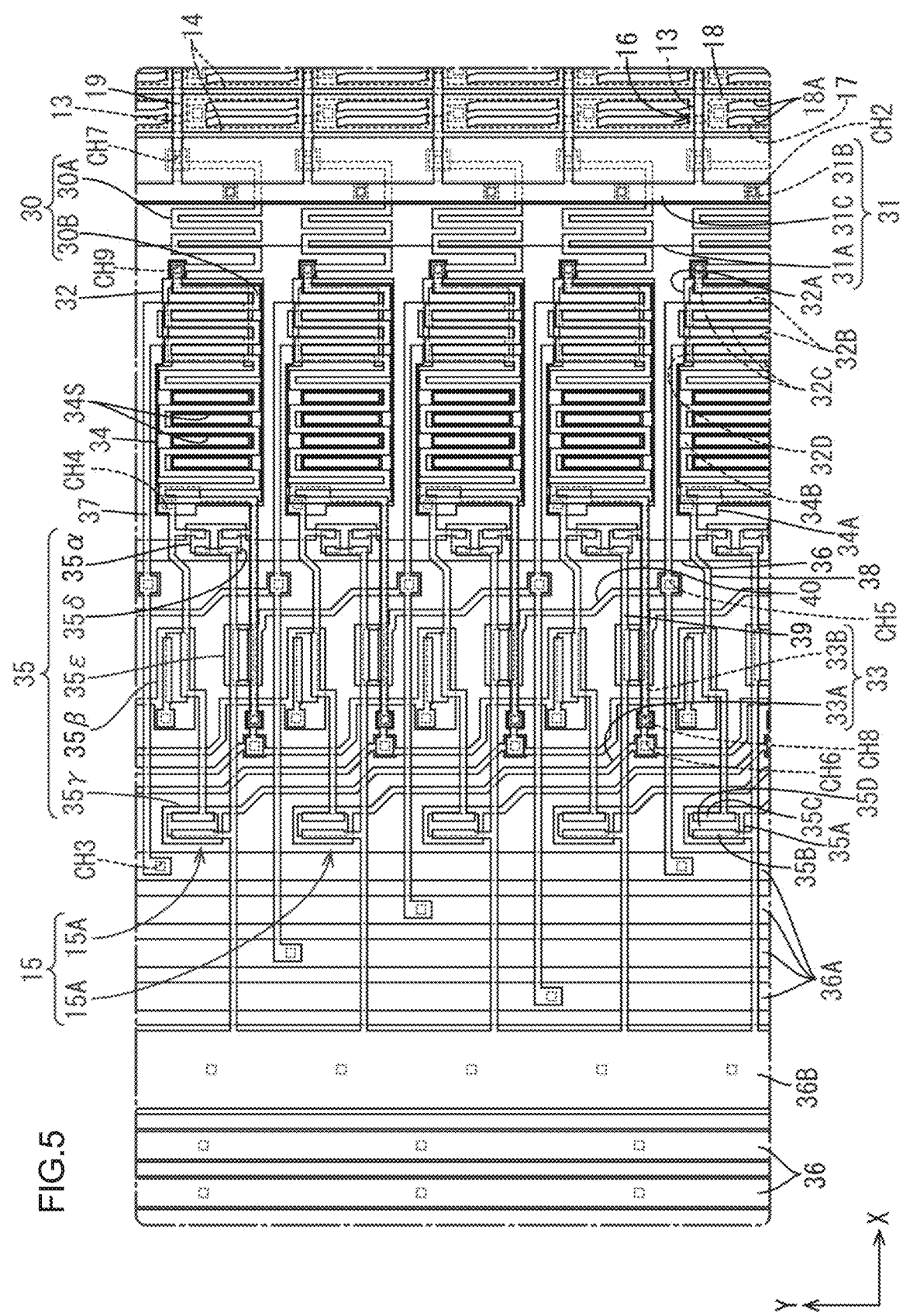
FIG. 5 is a plan view showing a configuration of a gate circuit section and its surroundings over the array substrate.
Figure 6:
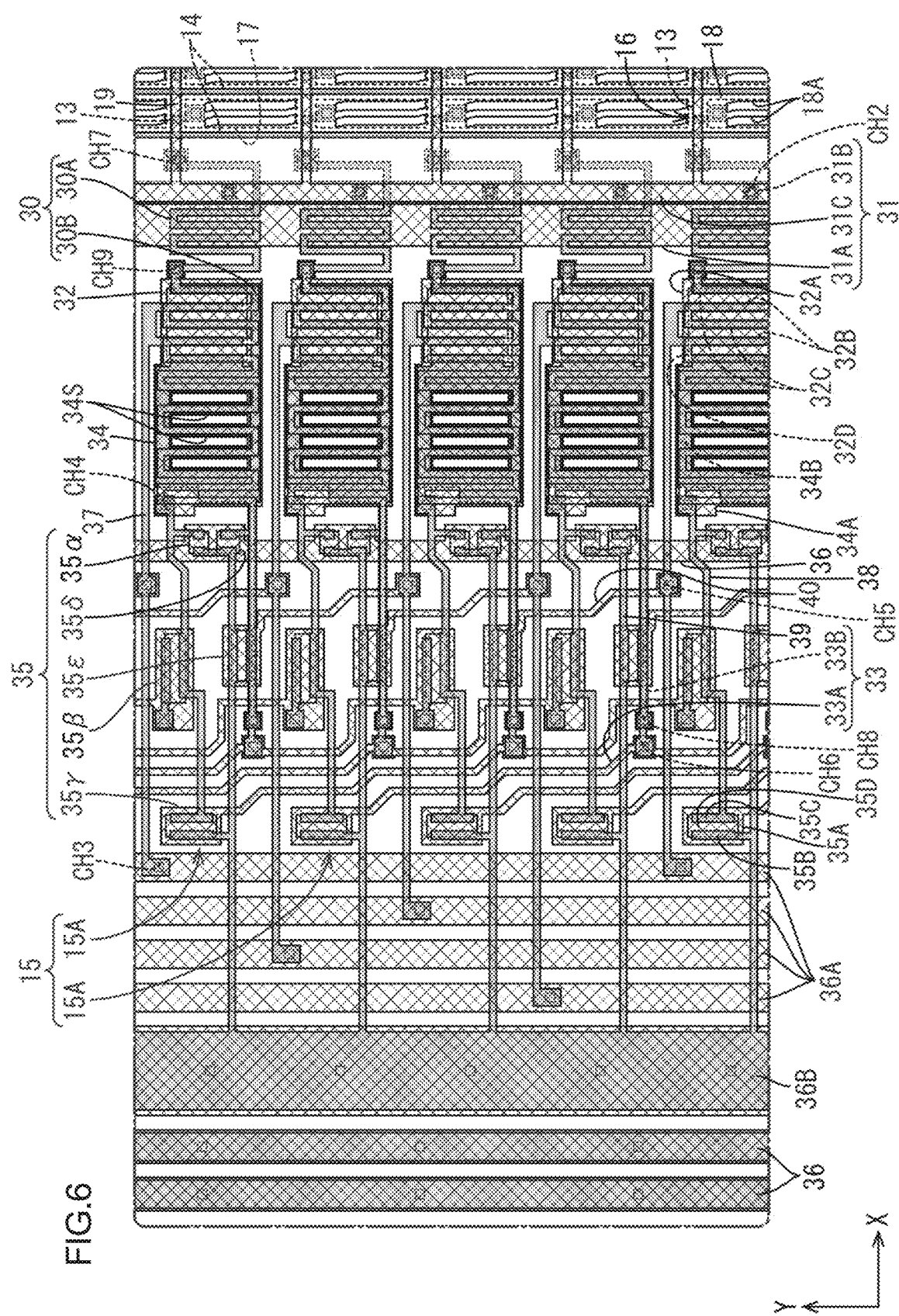
FIG. 6 is a plan view mainly showing patterns of a first metal film and a second metal film for the configuration of the gate circuit section and its surroundings.
Figure 7:
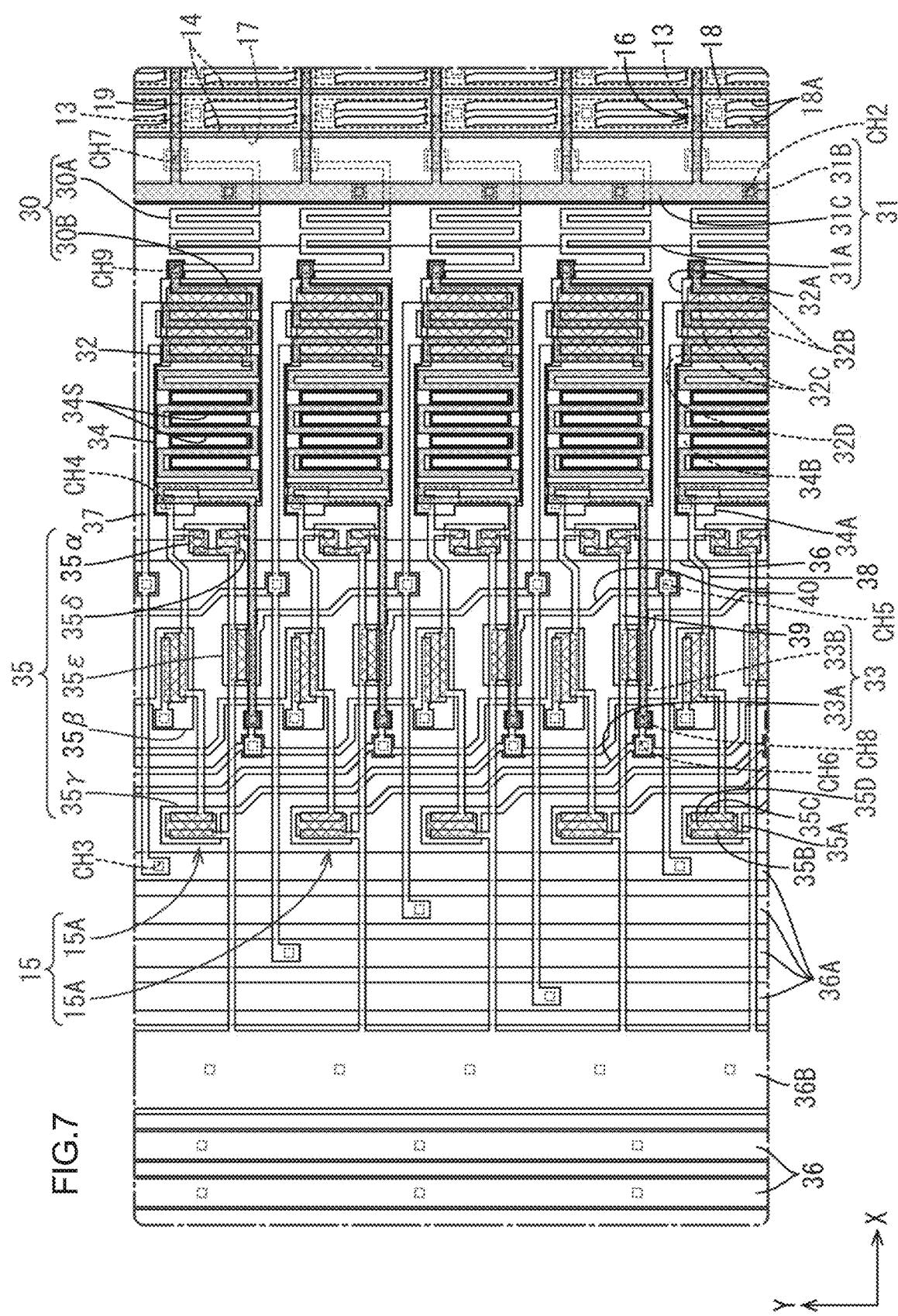
FIG. 7 is a plan view mainly showing patterns of a semiconductor film and a third metal film for the configuration of the gate circuit section and its surroundings.
Figure 8:
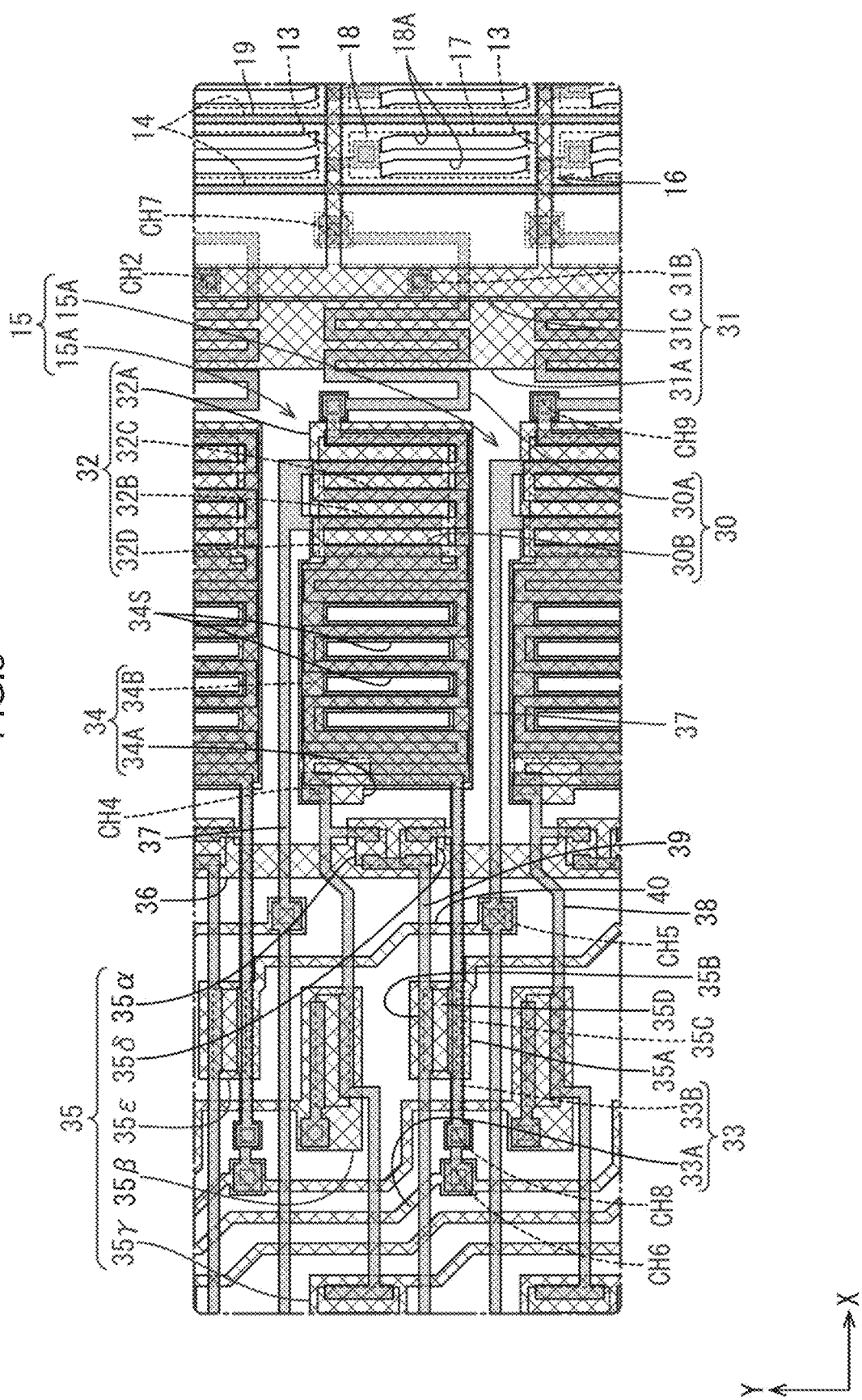
FIG. 8 is an enlarged plan view mainly showing the patterns of the first metal film and the second metal film for the configuration of the gate circuit section and its surroundings.
Figure 9:
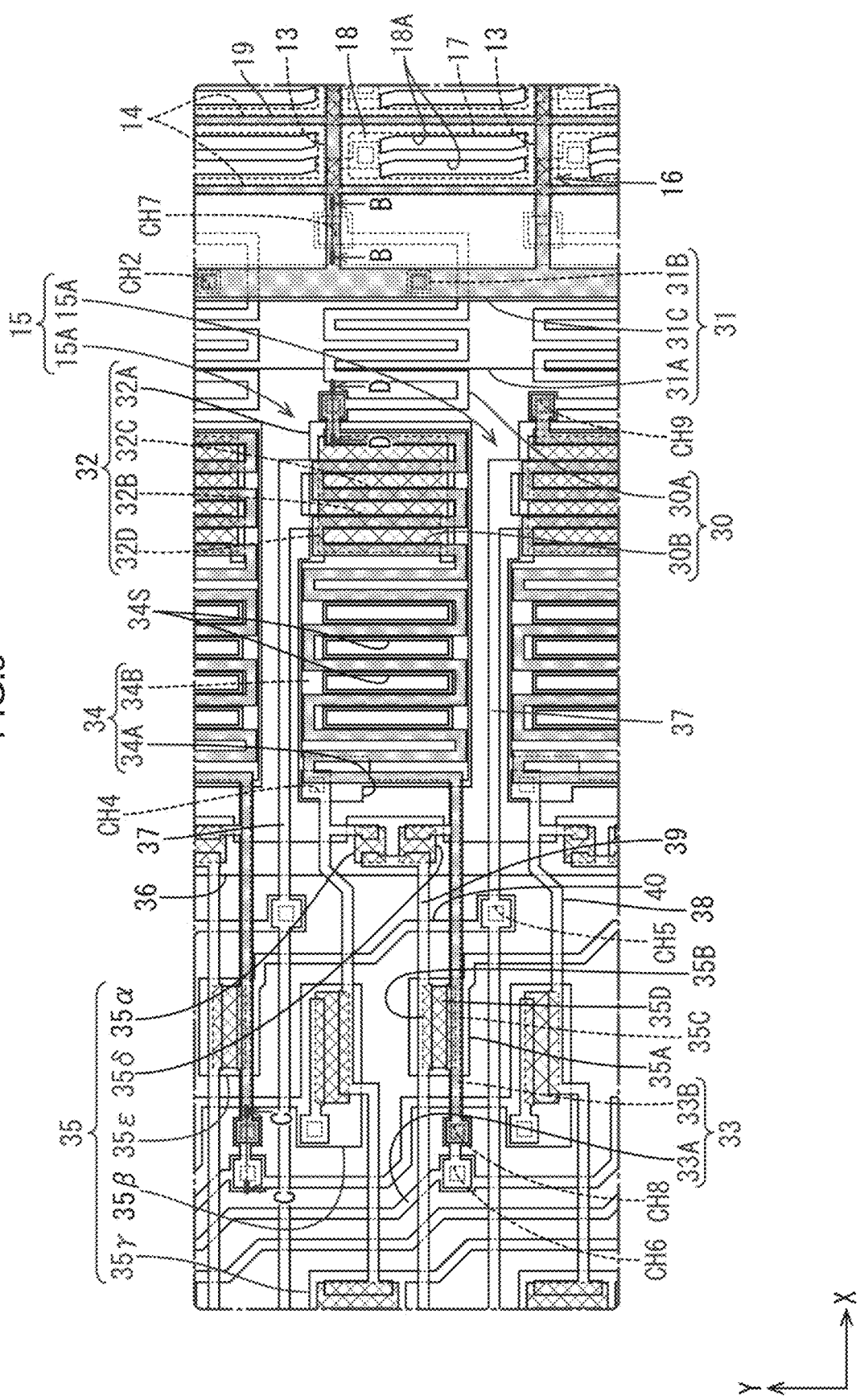
FIG. 9 is an enlarged plan view mainly showing the patterns of the semiconductor film and the third metal film for the configuration of the gate circuit section and its surroundings.

Next, a configuration of the gate circuit section 15 and its surroundings is described with reference to FIGS. 5 to 9. FIG. 5 is a plan view showing a configuration of the gate circuit section 15 and its surroundings over the array substrate 10A. FIG. 6 is a plan view mainly showing patterns of the first metal film 20 and the second metal film 23 for the configuration of the gate circuit section 15 and its surroundings. FIG. 7 is a plan view mainly showing patterns of the semiconductor film 22 and the third metal film 29 for the configuration of the gate circuit section 15 and its surroundings. FIG. 8 is an enlarged plan view of a part of FIG. 6. FIG. 9 is an enlarged plan view of a part of FIG. 7. FIGS. 6 and 8 apply half-tone dot meshing to the first metal film 20 and the second metal film 23 differently. FIGS. 7 and 9 apply half-tone dot meshing to the semiconductor film 22 and the third metal film 29 differently. Between the gate circuit section 15 and the display area AA, which are arranged along the X-axis direction, as shown in FIG. 5, a plurality of connecting lines 30 connected to the gate circuit section 15 and the gate lines 13 disposed in the display area AA and a common trunk line 31 connected to the common line 19 disposed in the display area AA are provided. Among these, as shown in FIGS. 6 and 7, the common trunk line 31 is constituted by a first trunk line constituent 31A composed of the first metal film 20, a second trunk line constituent 31B composed of the second metal film 23, and a third trunk line constituent (line) 31C composed of the third metal film 29. The first trunk line constituent 31A and the third trunk line constituent 31C both have band shapes extending along the Y-axis direction, and are disposed so as to overlap each other. The third trunk line constituent 31C is narrower in width than the first trunk line constituent 31A. The second trunk line constituent 31B has island shapes, and a plurality of the second trunk line constituents 31B are arranged side by side at spacings along the Y-axis direction. The second trunk line constituent 31B is sandwiched between the first trunk line constituent 31A and the third trunk line constituent 31C in a Z-axis direction, and are connected to the first trunk line constituent 31A and the third trunk line constituent 31C through a trunk line contact hole CH2 bored through the insulating films 21, 24, 25, and 27 sandwiched between the first trunk line constituent 31A and the third trunk line constituent 31C.

The gate circuit section 15 is described in detail. The gate circuit section 15 is a so-called shift register circuit and, as shown in FIG. 5, includes a plurality of unit circuit components 15A. The plurality of unit circuit components 15A are linearly arranged side by side along the Y-axis direction, and are arrayed at spacings which are substantially equal to those at which the gate lines 13 are arrayed (i.e. the long-side dimensions of the pixel electrodes 17). The plurality of unit circuit components 15A are individually connected to and can individually supply scanning signals to the plurality of gate lines 13 via the plurality of connecting lines 30. The number of unit circuit components 15A that the gate circuit section 15 includes is equal to both the number of gate lines 13 provided and the number of connecting lines 30 provided. Moreover, the plurality of unit circuit components 15A constituting the gate circuit section 15, by being connected to one another, can supply scanning signals to the plurality of gate lines 13 in sequence starting from the upper stage. Further, the gate circuit section 15 is disposed so that a great portion of the gate circuit section 15 overlaps the seal 10D (see FIG. 1) in plan view and constitutes a "seal overlap portion".

A circuit configuration of each of the unit circuit components 15A is described. As shown in FIG. 5, each of the unit circuit components 15A includes an output transistor (circuit element) 32 that outputs a scanning signal, a signal outputter 33 that transmits, to a corresponding one of the connecting lines 30, a scanning signal outputted from the output transistor 32, a capacitance former (circuit element) 34 that bootstraps a drive voltage of the output transistor 32 (i.e. the electric potential of a gate electrode 32A of the output transistor 32) to a higher potential than a scanning signal outputted from the output transistor 32, and a plurality of control transistors (circuit elements) 35. The output transistor 32 is located closest in the unit circuit components 15A to the display area AA and the common trunk line 31 in the X-axis direction. The capacitance former 34 is located adjacent to a side of the output transistor 32 opposite to the display area AA in the X-axis direction. The capacitance former 34, which almost entirely serves as a "seal overlap portion" that overlaps the seal 10D and occupies the largest area of the circuit elements constituting the unit circuit component 15A, may most block ultraviolet rays with which the seal 10D, which is disposed to overlap the gate circuit section 15, is irradiated. Accordingly, the capacitance former 34 has a plurality of slits 34S bored therethrough, and transmission of ultraviolet rays through the slits 34S allows the seal 10D to acceleratedly become cured. The slits 34S have vertically long square shapes in plan view, and are arrayed at substantially equal spacings in the X-axis direction. The plurality of control transistors 35 are decentrally disposed in a predetermined area spaced from a side of the capacitance former 34 opposite to the display area AA in the X-axis direction. In the present embodiment, the number of control transistors 35 that one unit circuit component 15A includes is 5, and in a case where a distinction is made among these five control transistors 35, they are referred to as "first control transistor 35α", "second control transistor 35β", "third control transistor 35γ", "fourth control transistor 35δ", and "fifth control transistor 35ε". As shown in FIGS. 6 to 9, the output transistor 32 includes a gate electrode 32A composed of the first metal film 20, a source electrode 32B composed of the second metal film 23, a drain electrode 32C composed of the second metal film 23, and a channel 32D composed of the semiconductor film 22, and each of the control transistors 35 includes a gate electrode 35A composed of the first metal film 20, a source electrode 35B composed of the second metal film 23, a drain electrode 35C composed of the second metal film 23, and a channel 35D composed of the semiconductor film 22. The signal outputter 33 includes a first output line 33A composed of the first metal film 20 and a second output line (output line) 33B composed of the second metal film 23. The capacitance former 34 includes a first electrode 34A composed of the first metal film 20 and a second electrode 34B composed of the second metal film 23, and the first electrode 34A and the second electrode 34B are disposed so as to overlap each other via the gate insulating film 21, which serves as a dielectric.

As shown in FIG. 5, the gate circuit section 15 includes a plurality of (in FIG. 5, eight) gate circuit signal lines 36 through which to supply various types of signal to such unit circuit components 15A. The plurality of gate circuit signal lines 36 each has a band shape linearly extending along the Y-axis direction. The plurality of gate circuit signal lines 36 include gate circuit signal lines (clock lines 36A) through which to supply clock signals for driving the transistors 32 and 35 of the plurality of unit circuit components 15A, a gate circuit signal line (power supply voltage line 36B) through which to supply a low-level power supply voltage to the transistors 32 and 35 and the capacitance formers 34, or other gate circuit signal lines 36. As shown in FIG. 6, the plurality of gate circuit signal lines 36 include gate circuit signal lines having single layer structures composed solely of the first metal film 20 and gate circuit signal lines having laminated structures composed of the first metal film 20 and the second metal film 23, which are connected to each other. All (seven) of the gate circuit signal lines 36 but the one that is described next are arranged side by side at spacings along the X-axis direction at a side of an area in which a group of the control transistors 35 are disposed opposite to the display area AA in the X-axis direction, and include at least four clock lines 36A and one power supply voltage line 36B. On the other hand, the remaining one gate circuit signal line 36 overlaps particular control transistors 35 (first control transistors 35α and fourth control transistors 35δ) in a place spaced from the side of the capacitance former 34 opposite to the display area AA in the X-axis direction, and partly constitutes the gate electrodes 35A of those control transistors 35.

As shown in FIGS. 6 and 8, the output transistor 32 has its gate electrode 32A connected in such a manner as to be joined directly to the first electrode 34A of the capacitance former 34. Accordingly, the output transistor 32 is configured to be driven when the electric potentials of the gate electrode 32A and the first electrode 34A of the capacitance former 34 take on values exceeding a threshold voltage. The output transistor 32 has its source electrode 32B connected to a first end of a first internal line 37, which is described next. The first internal line 37 has its second end connected to a clock line 36A of the gate circuit signal lines 36 and can supply the source electrode 32B of the output transistor 32 with a clock signal being transmitted through the clock line 36A. The first internal line 37 is composed of the second metal film 23, for example, like the source electrode 32B, and extends substantially along the X-axis direction from the clock line 36A to the source electrode 32B of the output transistor 32. The first internal line 37 and the clock line 36A are connected to each other through a clock line contact hole CH3 bored through the gate insulating film 21, which is sandwiched between the first internal line 37 and the clock line 36A. The output transistor 32 has its drain electrode 32C connected to the second electrode 34B of the capacitance former 34. The second electrode 34B of the capacitance former 34 is connected to the second output line 33B of the signal outputter 33. Accordingly, when the output transistor 32 is driven, a clock signal supplied to the source electrode 32B is transmitted to the drain electrode 32C, so that the second electrode 34B of the capacitance former 34 and the second output line 33B of the signal outputter 33 are brought to electric potentials pertaining to the clock signal.

As shown in FIGS. 6 and 8, the capacitance former 34 has its first electrode 34A connected to a first end of a second internal line 38, which is described next. The second internal line 38 is composed of the second metal film 23. The second internal line 38 and the first electrode 34A are connected to each other through a first electrode contact hole CH4 bored through the gate insulating film 21, which is sandwiched between the second internal line 38 and the first electrode 34A. In addition to being connected to the first electrode 34A, the second internal line 38 is also connected to the drain electrode 35C of the first control transistor 35α, and the drain electrode 35C of the second control transistor 35β, and the drain electrode 35C of the third control transistor 35γ. Among these, the second control transistor 35β has both its gate electrode 35A and its source electrode 35B connected to the first output line 33A of the signal outputter 33 of the immediately preceding unit circuit component 15A but one. That is, the second control transistor 35β is driven on the basis of a scanning signal outputted from the signal outputter 33 of the immediately preceding unit circuit component 15A but one, and can pre-charge the second internal line 38 to a high-level potential based on the scanning signal. When the second internal line 38 is pre-charged, the first electrode 34A of the capacitance former 34 and the gate electrode 32A of the output transistor 32 become equal in electric potential to the second internal line 38. This causes the output transistor 32 to be driven. When a clock signal that is supplied to the drain electrode 32C of an output transistor 32 changes in electric potential from a low level to a high level in a state where the output transistor 32 is driven, the second internal line 38 is boosted up (bootstrapped) to an electric potential of a higher level via a capacitance formed by the capacitance former 34. Meanwhile, the first control transistor 35α and the third control transistor 35γ have their respective source electrodes 35B connected to a first end of a third internal line 39, which is described next. The third internal line 39 is composed of the second metal film 23, has its second end connected to the power supply voltage line 36B, and extends substantially along the X-axis direction from the power supply voltage line 36B toward the capacitance former 34. Accordingly, when the first control transistor 35α and the third control transistor 35γ are driven, the electric potential of the second internal line 38 can be changed to the same low-level potential as that of the power supply voltage line 36B. The gate electrode 35A of the first control transistor 35α is composed of a portion of the gate circuit signal line 36 overlapping the first control transistor 35α.

As shown in FIGS. 6 and 8, the second output line 33B of the signal outputter 33 is extended from the second electrode 34B of the capacitance former 34 in a direction parallel to the X-axis direction and opposite to the display area AA and, in addition to being connected to the after-mentioned connecting line 30, is connected to the respective drain electrodes 35C of the fourth control transistor 35δ and the fifth control transistor 35ε. The fourth control transistor 35δ and the fifth control transistor 35ε have their respective source electrodes 35B connected to the aforementioned third internal line 39. Accordingly, by driving at least either the fourth control transistor 35δ or the fifth control transistor 35ε, the electric potential of the signal outputter 33 can be changed to the same low-level potential as that of the power supply voltage line 36B. Among these, the gate electrode 35A of the fourth control transistor 35δ is composed of a portion of the gate circuit signal line 36 overlapping the fourth control transistor 35δ; therefore, when the gate circuit signal line 36 is supplied with a signal, the fourth control transistor 35δ is driven at the same timing as the first control transistor 35α. Further, the fifth control transistor 35ε has its gate electrode 35A connected to an external line 40. The external line 40 is composed of the first metal film 20, extends along the Y-axis direction, and is connected to the first internal line 37 of the immediately subsequent unit circuit component 15A but one. The external line 40 and the first internal line 37 are connected to each other through an external line contact hole CH5 bored through the gate insulating film 21, which is sandwiched between the external line 40 and the first internal line 37.

As shown in FIG. 6, the first output line 33A of the signal outputter 33 is connected to an extended end of the second output line 33B opposite to the second electrode 34B (i.e. to the display area AA). The first output line 33A and the second output line 33B are connected to each other through an output line contact hole CH6 bored through the gate insulating film 21, which is sandwiched between the first output line 33A and the second output line 33B (see FIG. 11). The first output line 33A extends substantially along the Y-axis direction and is routed in such a manner as to pass transversely across the adjacent unit circuit components 15A located immediately at the preceding stage (up in FIG. 6) and the subsequent stage (down in FIG. 6) in the Y-axis direction. The first output line 33A has its first end connected to the gate electrode 35A of the third transistor 35γ of the immediately preceding unit circuit component 15A but one, and has its second end connected to the gate electrode 35A and source electrode 35B of the control transistor 35β of the immediately subsequent unit circuit component 15A but one. Accordingly, when the signal outputter 33 is brought to a high-level potential by driving of the output transistor 32, the third control transistor 35γ of the second unit circuit component 15A is driven, so that the signal outputter 33 connected to the third control transistor 35γ is changed to the same low-level potential as that of the power supply voltage line 36B. Along with this, the second control transistor 35β of the immediately subsequent unit circuit component 15A but one is driven, so that the electric potential of the second internal line 38 connected to the second control transistor 35β is pre-charged to a high-level potential.

Next, the connecting line 30 is described in detail. As shown in FIGS. 6 and 7, at least a portion of the connecting line 30 is constituted by the third metal film 29. Between the third metal film 29 and the first metal film 20, which constitutes the circuit elements of the gate circuit section 15, the gate insulating film 21, the first interlayer insulating film 24, the planarizing film 25, and the second interlayer insulating film 27, which are insulating films, are sandwiched (see FIG. 4). Similarly, between the third metal film 29 and the second metal film 23, which constitutes the circuit elements of the gate circuit section 15, the first interlayer insulating film 24, the planarizing film 25, and the second interlayer insulating film 27, which are insulating films, are sandwiched. This makes it possible to avoid a short circuit with the circuit elements of the gate circuit section 15 regardless of the path of routing of the connecting line 30, at least a portion of which is constituted by the third metal film 29. That is, as compared with the conventional case where the placement of the wire routing portion is limited to the area between the connection terminal section and the panel display picture element section, the path of routing of the connecting line 30 can be liberalized. This provides a higher degree of freedom in the adjustment of a time constant pertaining to the transmission characteristics of a signal that is transmitted by the connecting line 30. This makes it possible to, without ensuring a wide frame width, increase a time constant pertaining to the transmission characteristics of a signal, to make it hard for display unevenness to occur due to a falling waveform of a scanning signal, and to achieve improved display quality of the liquid crystal panel 10.

Figure 10:
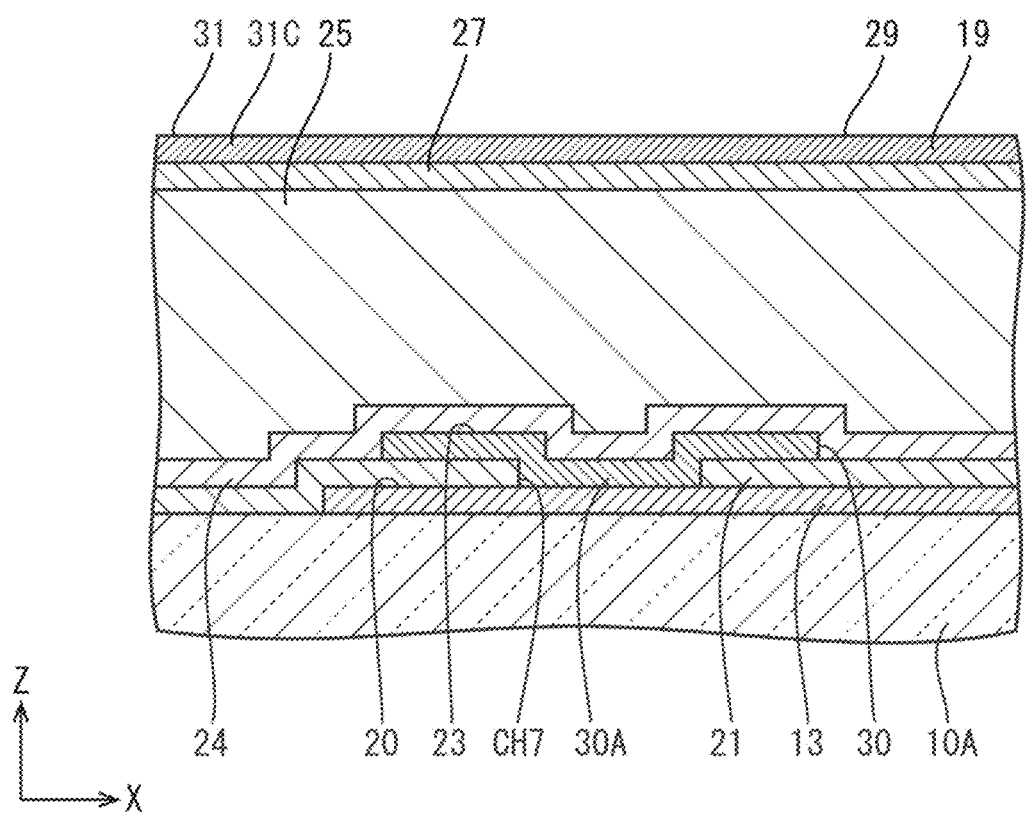
FIG. 10 is a cross-sectional view of the array substrate as taken along line B-B in FIG. 9.
Figure 11:
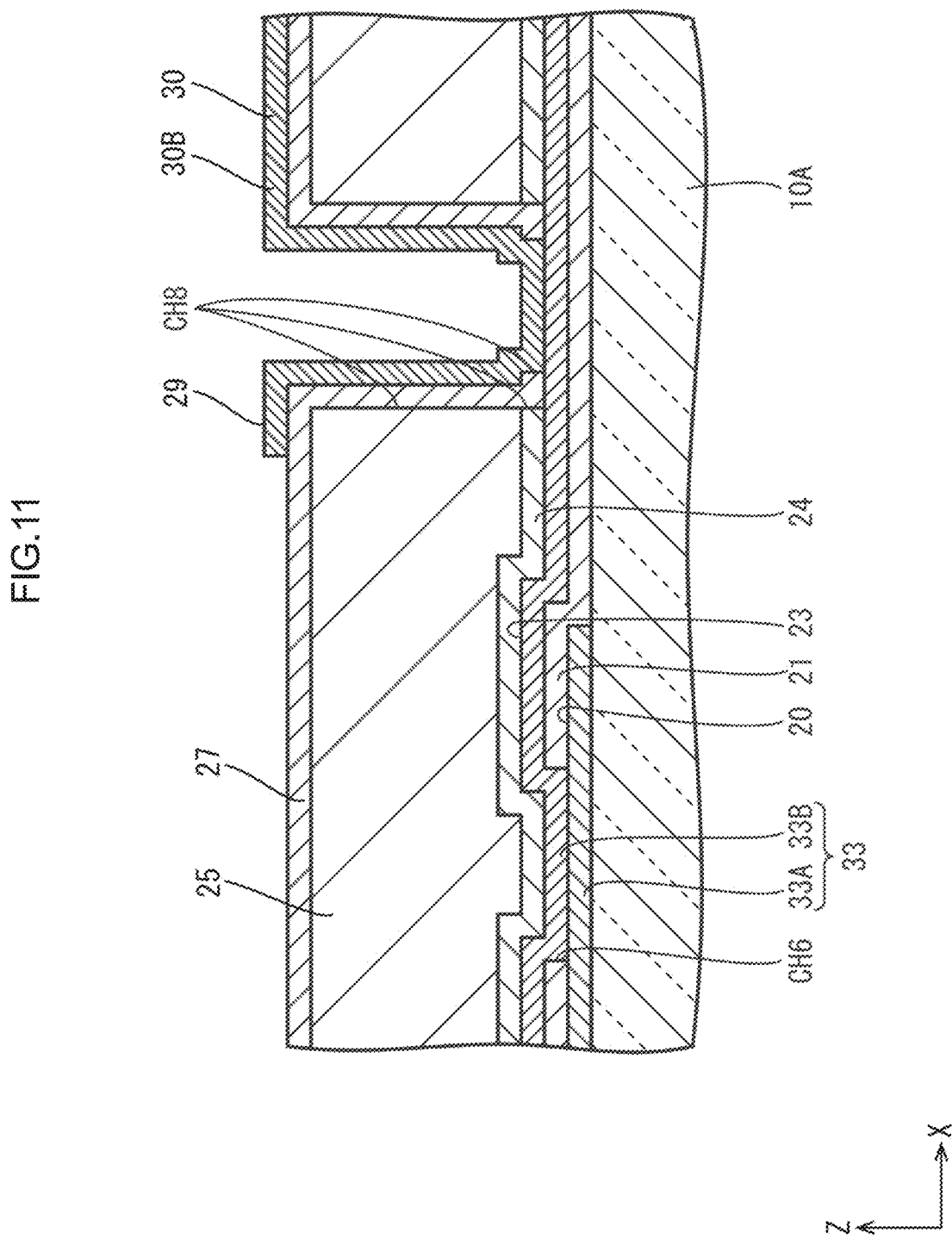
FIG. 11 is a cross-sectional view of the array substrate as taken along line C-C in FIG. 9.

Specifically, as shown in FIGS. 8 and 9, the connecting line 30 is constituted by a second metal film constituent (second conducting film constituent) 30A composed of the second metal film 23 and a third metal film constituent (third conducting film constituent) 30B composed of the third metal film 29. The second metal film constituent 30A has its first end connected to the gate line 13, which is composed of the first metal film 20, while overlapping an end of the gate line 13. The point of connection between the second metal film constituent 30A and the gate line 13 is located at a side of the common trunk line 31 that faces the display area AA (opposite to the signal outputter 33) in the X-axis direction. As shown in FIG. 10, the gate insulating film 21, which is sandwiched between the second metal film constituent 30A and the gate line 13, has a gate line contact hole CH7 bored therethrough in such a place as to overlap both the second metal film constituent 30A and the gate line 13. FIG. 10 is a cross-sectional view of the point of connection between the second metal film constituent 30A and the gate line 13 and an area therearound. The second metal film constituent 30A and the gate line 13 are connected to each other through the gate line contact hole CH7. The third metal film constituent 30B has its first end connected to a second output line 33B constituting a signal outputter 33 of the gate circuit section 15. Although described in detail later, the point of connection between the third metal film constituent 30B and the second output line 33B is located at a side of the common trunk line 31 that faces the signal outputter 33 (opposite to the display area AA) in the X-axis direction. As shown in FIG. 11, the first interlayer insulating film 24, the planarizing film 25, and the second interlayer insulating film 27, which are sandwiched between the third metal film constituent 30B and the second output line 33B, have a signal outputter contact hole CH8 bored therethrough in such a place as to overlap both the third metal film constituent 30B and the second output line 33B. FIG. 11 is a cross-sectional view of the point of connection between the third metal film constituent 30B and the second output line 33B and an area therearound. The third metal film constituent 30B and the second output line 33B are connected to each other through the signal outputter contact hole CH8.

Figure 12:
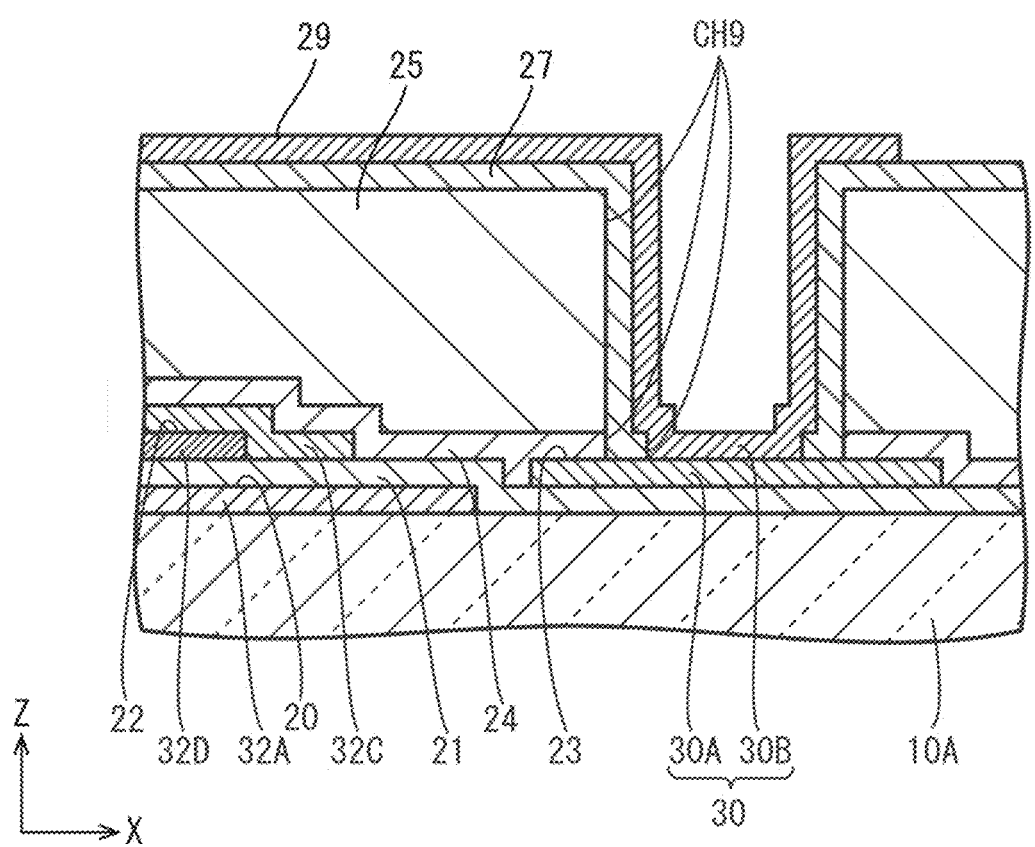
FIG. 12 is a cross-sectional view of the array substrate as taken along line D-D in FIG. 9.

Moreover, as shown in FIGS. 8 and 9, the second metal film constituent 30A and the third metal film constituent 30B have their respective second ends connected to each other. The point of connection between the second metal film constituent 30A and the third metal film constituent 30B is located at a side of the output transistor 32, which serves as an end of the gate circuit section 15 that faces the display area AA, that faces the display area AA in the X-axis direction and at a side of the common trunk line 31 opposite to the display area AA in the X-axis direction. As shown in FIG. 12, the first interlayer insulating film 24, the planarizing film 25, and the second interlayer insulating film 27, which are sandwiched between the second metal film constituent 30A and the third metal film constituent 30B, have an inter-metal-film-constituent contact hole CH9 bored therethrough in such a place as to overlap both the second metal film constituent 30A and the third metal film constituent 30B. FIG. 12 is a cross-sectional view of the point of connection between the second metal film constituent 30A and the third metal film constituent 30B and an area therearound. The second metal film constituent 30A and the third metal film constituent 30B are connected to each other through the inter-metal-film-constituent contact hole CH9. With such a configuration, a signal outputted from a signal outputter 33 of the gate circuit section 15 is supplied to the gate line 13 after being transmitted from the third metal film constituent 30B constituting the connecting line 30 to the second metal film constituent 30A constituting the connecting line 30. Since the connecting line 30 includes the second metal film constituent 30A as well as the third metal film constituent 30B, a higher degree of freedom can be secured in the path of routing of the connecting line 30. Specifically, as shown in FIGS. 8 and 9, the second metal film constituent 30A constituting the connecting line 30 is disposed so as to pass transversely across the third trunk line constituent 31C of the common trunk line 31. In particular, the second metal film constituent 30A passes transversely across the first and third trunk line constituents 31A and 31C, which constitute the common trunk line 31 and extend along the Y-axis direction, at a midpoint between the point of connection between the second metal film constituent 30A and the third metal film constituent 30B and the point of connection between the second metal film constituent 30A and the gate line 13. Between the second metal film constituent 30A and the third metal film constituent 30B, the gate insulating film 21 is sandwiched, and between the second metal film constituent 30A and the third trunk line constituent 31C, the first interlayer insulating film 24, the planarizing film 25, and the second interlayer insulating film 27 are sandwiched. This makes it possible to prevent the connecting line 30 from being short-circuited with the common trunk line 31.

As shown in FIGS. 8 and 9, the point of connection between the third metal film constituent 30B constituting the connecting line 30 and the second output line 33B of the signal outputter 33 is located at a side of the output transistor 32, which serves as an end of the gate circuit section 15 that faces the display area AA, opposite to the display area AA in the X-axis direction. Furthermore, the point of connection between the third metal film constituent 30B and the second output line 33B is located at a side of the capacitance former 34 opposite to the output transistor 32 (i.e. to the display area AA) in the X-axis direction. Besides, the point of connection between the third metal film constituent 30B and the second output line 33B is located at a side of at least one of the control transistors 35 opposite to the capacitance former 34 (i.e. to the display area AA) in the X-axis direction. More specifically, the third metal film constituent 30B is connected to the second output line 33B in a place located at a side of the point of connection between the first output line 33A and the second output line 33B (i.e. the output line contact hole CH6) that faces the display area AA in the X-axis direction. The placement of the point of connection between the third metal film constituent 30B and the second output line 33B in such a place makes it possible to greatly increase the creeping distance of the connecting line 30. This is suitable to increasing a time constant pertaining to the transmission characteristics of a signal that is transmitted by the connecting line 30.

Moreover, as shown in FIG. 9, the third metal film constituent 30B constituting the connecting line 30 is routed so as to pass transversely across the output transistor 32, the capacitance former 34, and the control transistors 35 while extending from the point of connection between the third metal film constituent 30B and the second output line 33B (i.e. the signal outputter contact hole CH8) to the point of connection between the second metal film constituent 30A and the third metal film constituent 30B (i.e. the inter-metal-film-constituent contact hole CH9). The third metal film constituent 30B thus routed, by being composed of the third metal film 29, can avoid being short-circuited with the output transistor 32, the capacitance former 34, and the control transistors 35, which are composed of the first metal film 20, the second metal film 23, and the like. Specifically, the third metal film constituent 30B extends substantially straight along the X-axis direction from the point of connection between the third metal film constituent 30B and the second output line 33B (i.e. the signal outputter contact hole CH8) to the capacitance former 34, and is disposed so as to overlap the second output line 33B. A portion of the third metal film constituent 30B that overlaps the second output line 33B is equal in line width to the second output line 33B. Since the third metal film constituent 30B and the second output line 33B, which overlap each other, are at the same potential, a parasitic capacitance is more hardly formed than in a case where a third metal film constituent overlaps another line that is different in electric potential therefrom. The third metal film constituent 30B passes transversely across the fifth control transistor 35ε while extending from the point of connection between the third metal film constituent 30B and the second output line 33B (i.e. the signal outputter contact hole CH8) to the capacitance former 34.

As shown in FIG. 9, the third metal film constituent 30B is routed so as to repeatedly meander within a range of the capacitance former 34 and the output transistor 32, which the third metal film constituent 30B pass transversely across while extending from the capacitance former 34 to the point of connection between the point of connection between the second metal film constituent 30A and the third metal film constituent 30B (i.e. the inter-metal-film-constituent contact hole CH9). That is, a portion of the third metal film constituent 30B that passes transversely across the capacitance former 34 and the output transistor 32 has a meandering shape. In particular, a portion of the third metal film constituent 30B that passes transversely across the capacitance former 34 is disposed so as to meander in such a manner as to circumvent the plurality of slits 34S, which are bored through the capacitance former 34, so as not to overlap any of the slits 34S. This makes it possible to avoid inhibition of transmission of light through the slits 34S. Further, a portion of the third metal film constituent 30B that passes transversely across the output transistor 32 is disposed so as to meander in such a manner as to overlap the source electrode 32B and the drain electrode 32C, each of which is shaped to branch off from the output transistor 32. The second metal film constituent 30A is routed so as to repeatedly meander within a range of the unit circuit component 15A while extending from the point of connection between the second metal film constituent 30A and the third metal film constituent 30B (i.e. the inter-metal-film-constituent contact hole CH9) to the point of connection between the second metal film constituent 30A and the gate line 13 (i.e. the gate line contact hole CH7). In this way, the connecting line 30 extends so as to repeatedly meander within the range of the unit circuit component 15A to which the connecting line 30 is connected. This makes it possible to sufficiently increase the creeping distance of the connecting line 30. This is suitable to increasing a time constant pertaining to the transmission characteristics of a signal that is transmitted by the connecting line 30.

As described above, an array substrate (substrate for a display device) 10A of the present embodiment includes a display area AA capable of displaying an image, a gate circuit section (signal supply circuit section) 15, disposed closer to an end than the display area AA, that has a circuit element including at least a first metal film (first conducting film) 20 and a second metal film (second conducting film) 23 with a gate insulating layer (insulating layer) 21 sandwiched between the first metal film 20 and the second metal film 23, a gate line (display line) 13 disposed in the display area AA, composed of the first metal film 20 or the second metal film 23, and supplied with a signal by the gate circuit section 15, and a connecting line 30 connected to the gate line 13 and the gate circuit section 15. At least a portion of the connecting line 30 is constituted by a third metal film (third conducting film) 29 with insulating films, namely a gate insulating film 21, a first interlayer insulating film 24, a planarizing film 25, and a second interlayer insulating film 27, sandwiched between the first metal film 20 and the third metal film 29 and with insulating films, namely the first interlayer insulating film 24, the planarizing film 25, and the second interlayer insulating film 27, sandwiched between the second metal film 23 and the third metal film 29.

In this way, the signal outputted from the gate circuit section 15 disposed close to an end than the display area AA is supplied via the connecting line 30 to the gate line 13 disposed in the display area AA. Since at least a portion of the connecting line 30 is constituted by the third metal film 29 with the gate insulating film 21, the first interlayer insulating film 24, the planarizing film 25, and the second interlayer insulating film 27, which are insulating films, sandwiched between the first metal film 20 and the connecting line 30 and with the first interlayer insulating film 24, the planarizing film 25, and the second interlayer insulating film 27, which are insulating films, sandwiched between the second metal film 23 and the connecting line 30, the connecting line 30 can avoid being short-circuited with the circuit element of the gate circuit section 15, regardless of the path of routing of the connecting line 30. Accordingly, as compared with the conventional case where the placement of the wire routing portion is limited to the area between the connection terminal section and the panel display picture element section, the path of routing of the connecting line 30 can be liberalized. This provides a higher degree of freedom in the adjustment of a time constant pertaining to the transmission characteristics of a signal that is transmitted by the connecting line 30. This makes it possible to, without ensuring a wide frame width, increase a time constant pertaining to the transmission characteristics of a signal and to make it hard for display unevenness to occur due to a falling waveform of a scanning signal.

Further, the connecting line 30 is connected to the gate circuit section 15 in a place located at a side of an end of the gate circuit section 15 that faces the display area AA opposite to the display area AA. This makes it possible to increase the creeping distance of the connecting line 30 by the difference between the end of the gate circuit section 15 that faces the display area AA and the place where the connecting line 30 is connected to the gate circuit section 15. This is suitable to increasing a time constant pertaining to the transmission characteristics of a signal that is transmitted by the connecting line 30.

Further, the gate circuit section 15 includes an output transistor 32 that outputs the signal as the circuit element, and a signal outputter 33, connected to the output transistor 32 and the connecting line 30, that transmits to the connecting line 30 the signal outputted from the output transistor 32, and the connecting line 30 is connected to the signal outputter 33 in a place located at a side of the output transistor 32 opposite to the display area AA, and is disposed so as to pass transversely across the output transistor 32. In this way, the signal outputted from the output transistor 32 is supplied to the connecting line 30 after being transmitted to the signal outputter 33. Since the connecting line 30 is connected to the signal outputter 33 in a place located at a side of the output transistor 32 opposite to the display area AA and is connected to the gate line 13 by extending in such a manner as to pass transversely across the output transistor 32, the creeping distance of the connecting line 30 can be more greatly increased. This makes it possible to further increase a time constant pertaining to the transmission characteristics of a signal that is transmitted by the connecting line 30.

Further, the gate circuit section 15 includes a capacitance former 34 disposed as the circuit element at a side of the output transistor 32 opposite to the display area AA, the capacitance former 34 has a first electrode 34A and a second electrode 34B that overlap each other via the gate insulating film (insulating film) 21, the output transistor 32 has a gate electrode 32A connected to either of the first electrode 34A and the second electrode 34B, the signal outputter 33 is connected to the other of the first electrode 34A and the second electrode 34B, and the connecting line 30 is connected to the signal outputter 33 in a place located at a side of the capacitance former 34 opposite to the output transistor 32, and is disposed so as to pass transversely across the capacitance former 34. In this way, the capacitance former 34 causes the electric potential of the gate electrode 32A of the output transistor 32 to be bootstrapped via a capacitance formed by the capacitance former 34 to a higher potential than the signal outputted from the output transistor 32. This makes it possible to increase the amount of electric current between the source electrode 32B and the drain electrode 32C of the output transistor 32, making more certain that the signal is stably supplied to the gate line 13. Since the connecting line 30 is connected to the signal outputter 33 in a place located at a side of the capacitance former 34 opposite to the output transistor 32 and is connected to the gate line 13 by extending in such a manner as to pass transversely across the capacitance former 34 and the output transistor 32, the creeping distance of the connection line 30 can be more greatly increased. This makes it possible to further increase a time constant pertaining to the transmission characteristics of a signal that is transmitted by the connecting line 30.

Further, the gate circuit section 15 includes a control transistor 35 disposed as the circuit element at a side of the capacitance former 34 opposite to the output transistor 32, and the connecting line 30 is connected to the signal outputter 33 in a place located at a side of the control transistor 35 opposite to the display area AA, and is disposed so as to pass transversely across the control transistor 35. In this way, the operation of the gate circuit section 15 is controlled by the control transistor 35. Since the connecting line 30 is connected to the signal outputter 33 in a place located at a side of the control transistor 35 opposite to the display area AA and is connected to the gate line 13 by extending in such a manner as to pass transversely across the control transistor 35, the capacitance former 34, and the output transistor 32, the creeping distance of the connection line 30 can be more greatly increased. This makes it possible to further increase a time constant pertaining to the transmission characteristics of a signal that is transmitted by the connecting line 30.

Further, the signal outputter 33 includes a second output line (output line) 33B connected to at least the capacitance former 34 and the control transistor 35 and composed of the second metal film 23, and the connecting line 30 is connected to the second output line 33B and disposed so as to overlap the second output line 33B. In this way, the signal outputted from the output transistor 32 is supplied to the capacitance former 34, the control transistor 35, and the connecting line 30 through the second output line 33B of the signal outputter 33. Since the connecting line 30 is disposed so as to overlap the second output line 33B, which is at the same potential as the connecting line 30, it is hard for the connecting line 30 to form a parasitic capacitance with another line that is different in electric potential from the connecting line 30.

Further, the gate line 13 is composed of the first metal film 20, and the connecting line 30 is constituted by a second metal film constituent 30A composed of the second metal film 23 and connected to the gate line 13 and a third metal film constituent 30B composed of the third metal film 29 and connected to the gate circuit section 15. In this way, the signal outputted from the gate circuit section 15 is supplied to the gate line 13 after being transmitted from the third metal film constituent 30B constituting the connecting line 30 to the second metal film constituent 30A of the connecting line 30. Since the connecting line 30 includes the second metal film constituent 30A as well as the third metal film constituent 30B, a higher degree of freedom can be secured in the path of routing of the connecting line 30.

Further, the array substrate 10A of the present embodiment further includes a third trunk line constituent (line) 31C extended along a cross direction crossing a direction of arrangement of the gate circuit section 15 and the display area AA, located between the display area AA and the gate circuit section 15, and composed of the third metal film 29. The connecting line 30 is disposed so that the second metal film constituent 30A passes transversely across the third trunk line constituent 31C. In this way, the connecting line 30, which is connected to the gate circuit section 15 and the gate line 13 disposed in the display area AA, is disposed so that the second metal film constituent 30A passes transversely across the third trunk line constituent 31C composed of the third metal film 29, although the connecting line 30 passes transversely across the third trunk line constituent 31C, which is disposed so as to extend along the cross direction, in a place between the gate circuit section 15 and the display area AA. This makes it possible to prevent the connecting line 30 from being short-circuited with the third trunk line constituent 31C.

Further, a plurality of the gate lines 13 are arranged side by side in the display area AA along a cross direction crossing a direction of arrangement of the gate circuit section 15 and the display area AA, the gate circuit section 15 includes a plurality of unit circuit components 15A each provided with the circuit element and arranged side by side along the cross direction, a plurality of the connecting lines 30 are individually connected to the plurality of gate lines 13 and the plurality of unit circuit components 15A, and the connecting line 30 is connected to the gate line 13 by extending so as to repeatedly meander within a range of the unit circuit component 15A to which the connecting line 30 is connected. In this way, the signals outputted from the respective signal outputters 33 of the plurality of unit circuit components 15A are individually supplied via the plurality of connecting lines 30 to the plurality of gate lines 13. Since the connecting line 30 is connected to the gate line 13 by extending so as to repeatedly meander within the range of the unit circuit component 15A to which the connecting line 30 is connected, the creeping distance of the connecting line 30 can be sufficiently increased. This is suitable to increasing a time constant pertaining to the transmission characteristics of a signal that is transmitted by the connecting line 30.

Further, a liquid crystal panel (display device) 10 according to the present embodiment includes the substrate described above and a CF substrate (counter substrate) 10B placed opposite the array substrate 10A. Such a liquid crystal panel 10 has improved display quality, as the array substrate 10A makes it hard for display unevenness to occur due to a falling waveform of a scanning signal.

Further, the liquid crystal panel 10 according to the present embodiment further includes a liquid crystal layer 10C sandwiched between the array substrate 10A and the CF substrate 10B and a seal 10D sandwiched between the array substrate 10A and the CF substrate 10B, disposed so as to surround the liquid crystal layer 10C, and made of a photocuring resin material. At least a portion of the gate circuit section 15 serves as a seal overlap portion, namely a capacitance former 34, disposed so as to overlap the seal 10D, the seal overlap portion, namely the capacitance former 34, has a slit 34S, bored therethrough, through which to transmit light, and the connecting line 30 is disposed in such a manner as to circumvent the slit 34S so as not to overlap the slit 34S. In this way, the liquid crystal layer 10C sandwiched between the array substrate 10A and the CF substrate 10B is sealed in by the seal 10B disposed so as to surround the liquid crystal layer 10C. The seal 10D is made of a photo-curable resin material, and acceleratedly becomes cured by being irradiated with light for curing. Since the gate circuit section 15 has the circuit element including the first metal film 20 and the second metal film 23, transmission of light for curing may be inhibited by the seal overlap portion, namely the capacitance former 34, which overlaps the seal 10D. In that regard, since the seal overlap portion, namely the capacitance former 34, has the slit 34S bored therethrough, the seal 10D is efficiently irradiated with light for curing through the slit 34S. Moreover, since the connecting line 30 is disposed in such a manner as to circumvent the slit 34S so as not to overlap the slit 34S, the creeping distance of the connecting line 30 can be sufficiently increased without inhibition of transmission of light through the slit 34S. This is suitable to increasing a time constant pertaining to the transmission characteristics of a signal that is transmitted by the connecting line 30.

Embodiment 2

Embodiment 2 of the present invention is described with reference to FIG. 13 or 14. Embodiment 2 illustrates changes made to achieve a configuration of connecting lines 130. It should be noted that a repeated description of structures, workings, and effects which are similar to those of Embodiment 1 is omitted.

Figure 13:
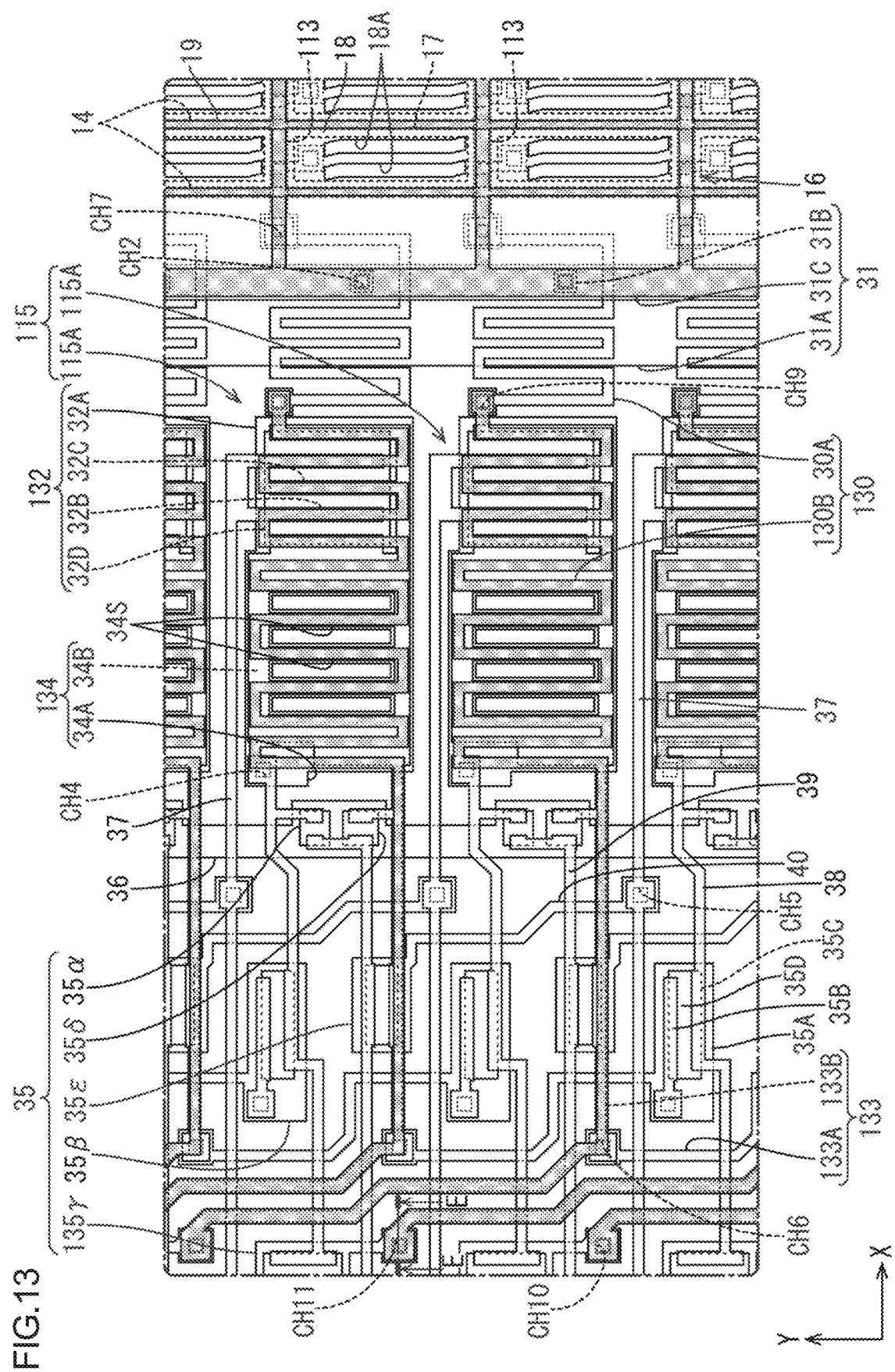
FIG. 13 is an enlarged plan view mainly showing a pattern of a third metal film for a configuration of a gate circuit section and its surroundings over an array substrate according to Embodiment 2 of the present invention.

As shown in FIG. 13, a connecting line 130 according to the present embodiment is routed so as to be connected to a signal outputter 133 in a place offset in the Y-axis direction from a unit circuit component 115A to which the connecting line 130 is connected. FIG. 13 is an enlarged plan view mainly showing a pattern of a third metal film 129 for a configuration of a gate circuit section 115 and its surroundings, and applies half-tone dot meshing to the third metal film 129. In particular, the connecting line 130 is constituted by a third metal film constituent 130B which is the same as its counterpart of Embodiment 1 in that the third metal film constituent 130B has a meandering portion that overlaps a capacitance former 134 and an output transistor 132 and a portion (second output line overlap portion) that overlaps a second output line 133B constituting the signal outputter 133 but which is different from that of Embodiment 1 in that the third metal film constituent 130B additionally has a portion (first output line overlap portion) that overlaps a first output line 133A. The first output line overlap portion of the third metal film constituent 130B that overlaps the first output line 133A extends along the Y-axis direction in such a manner as to run parallel to the first output line 133A, and passes transversely across the immediately preceding unit circuit component 115A. In particular, the first output line overlap portion of the third metal film constituent 130B extends from the point of connection between the first output line 133A and the second output line 133B (i.e. the output line contact hole CH6), passes transversely across the unit circuit component 115A to which the connecting line 130 is connected and the immediately preceding unit circuit component 115A, and is connected to the first output line 133A, which the first output line overlap portion overlaps, in the vicinity of a third control transistor 135γ constituting the immediately preceding unit circuit component 115A but one. Such a configuration makes it possible to more greatly increase the creeping distance of the connecting line 130 as compared with Embodiment 1. This makes it possible to further increase a time constant pertaining to the transmission characteristics of a signal that is transmitted by the connecting line 130.

Figure 14:
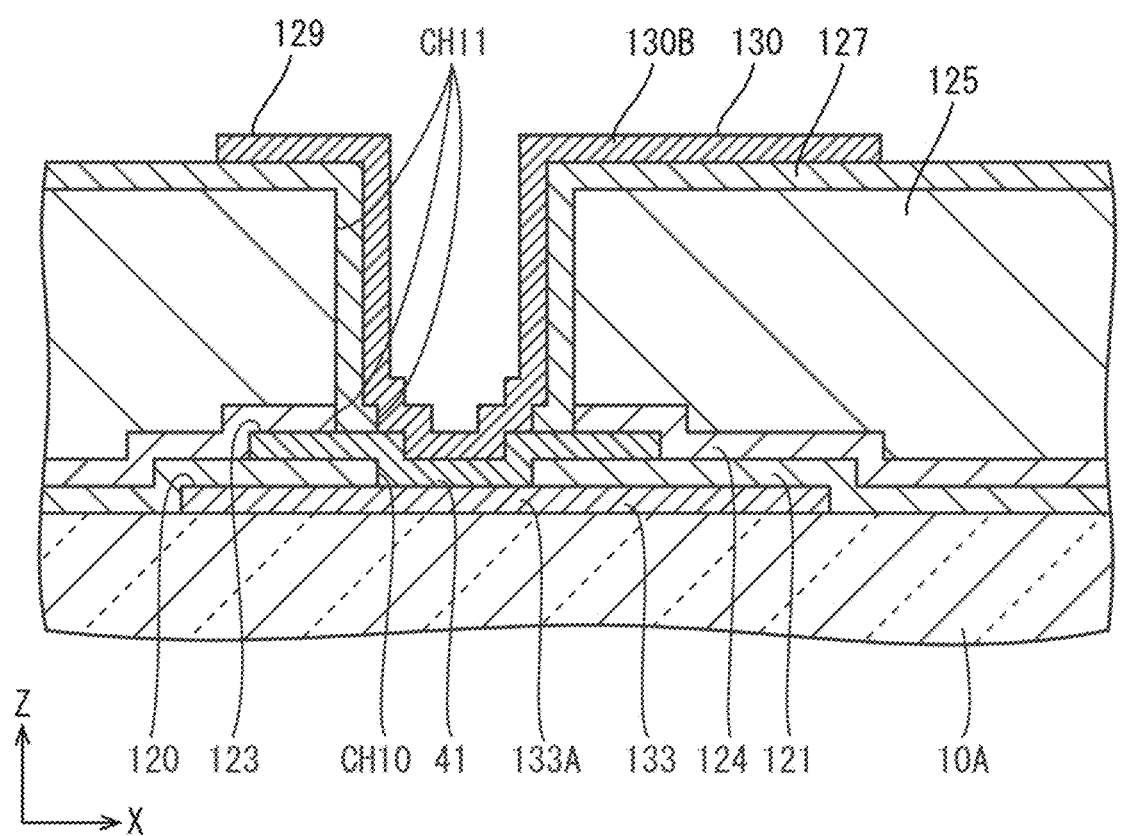
FIG. 14 is a cross-sectional view of the array substrate as taken along line E-E in FIG. 13.

As shown in FIG. 14, the third metal film constituent 130B and the first output line 133A is connected to each other via an intermediate electrode 41 composed of a second metal film 123. The intermediate electrode 41 has a square island shape in plan view. A gate insulating film 121 sandwiched between the first output line 133A, which is composed of a first metal film 120, and the intermediate electrode 41 has a first signal outputter contact hole CH10 bored therethrough in such a place as to overlap both the first output line 133A and the intermediate electrode 41. The first output line 133A and the intermediate electrode 41 are connected to each other through the first signal outputter contact hole CH10. A first interlayer insulating film 124, a planarizing film 125, and a second interlayer insulating film 127, which are sandwiched between the third metal film constituent 130B and the intermediate electrode 41, have a second signal outputter contact hole CH11 bored therethrough in such a place as to overlap both the third metal film constituent 130B and the intermediate electrode 41. The third metal film constituent 130B and the intermediate electrode 41 are connected to each other through the second signal outputter contact hole CH11.

According to the present embodiment, as described above, a plurality of the gate lines 113 are arranged side by side in the display area AA along a cross direction crossing a direction of arrangement of the gate circuit section 115 and the display area AA, the gate circuit section 115 includes a plurality of unit circuit components 115A each provided with the circuit element and arranged side by side along the cross direction, a plurality of the connecting lines 130 are individually connected to the plurality of gate lines 113 and the plurality of unit circuit components 115A, the plurality of unit circuit components 115A each has a signal outputter 133, connected to the connecting line 130, that outputs the signal to the connecting line 130, at least a portion of the signal outputter 133 extends along the cross direction so as to pass transversely across the unit circuit component 115A adjacent in the cross direction, the connecting line 130 is connected to the signal outputter 133 in a place offset in the cross direction from the unit circuit component 115A to which the connecting line 130 is connected, and is disposed so as to pass transversely across the unit circuit component 115A adjacent to the unit circuit component 115A to which the connecting line 130 is connected. In this way, the signals outputted from the respective signal outputters 133 of the plurality of unit circuit components 115A are individually supplied via the plurality of connecting lines 130 to the plurality of gate lines 113. Since the connecting line 130 is connected to the gate line 113 in a place offset in the cross direction from the unit circuit component 115A to which the connecting line 130 is connected, and is disposed so as to pass transversely across the unit circuit component 115A adjacent to the unit circuit component 115A to which the connecting line 130 is connected, the creeping distance of the connecting line 130 can be more greatly increased. This makes it possible to further increase a time constant pertaining to the transmission characteristics of a signal that is transmitted by the connecting line 130.

Embodiment 3

Embodiment 3 of the present invention is described with reference to FIG. 15 or 16. Embodiment 3 illustrates changes made from Embodiment 1 to achieve a configuration of connecting lines 230. It should be noted that a repeated description of structures, workings, and effects which are similar to those of Embodiment 1 is omitted.

Figure 15:
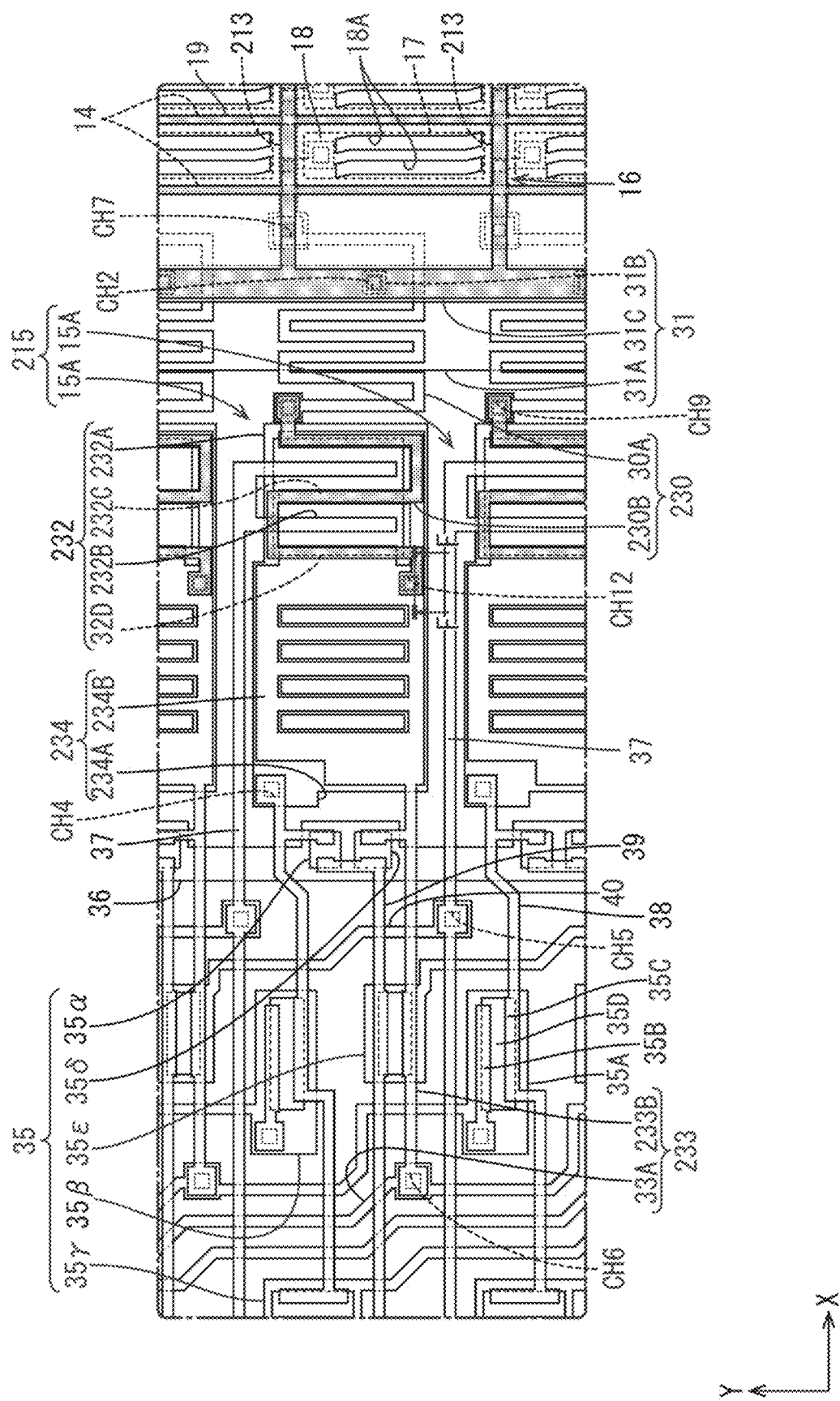
FIG. 15 is an enlarged plan view mainly showing a pattern of a third metal film for a configuration of a gate circuit section and its surroundings over an array substrate according to Embodiment 3 of the present invention.
Figure 16:
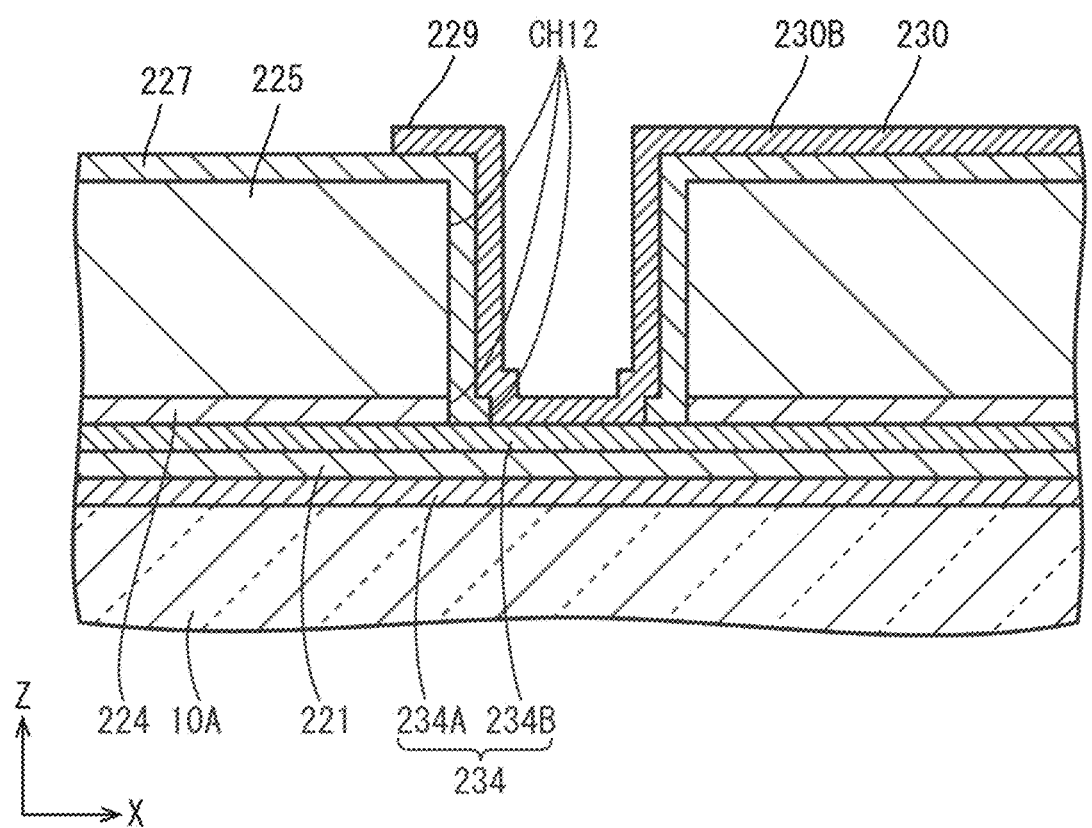
FIG. 16 is a cross-sectional view of the array substrate as taken along line F-F in FIG. 15.

As shown in FIG. 15, a connecting line 230 according to the present embodiment is connected to a signal outputter 233 in such a place as to overlap a portion of a capacitance former 234. FIG. 15 is an enlarged plan view mainly showing a pattern of a third metal film 229 for a configuration of a gate circuit section 215 and its surroundings, and applies half-tone dot meshing to the third metal film 229. In particular, the connecting line 230 is constituted by a third metal film constituent 230B which is the same as its counterpart of Embodiment 1 in that the third metal film constituent 230B has a meandering portion that overlaps an output transistor 232 but which is different from that of Embodiment 1 in that a portion of the third metal film constituent 230B that overlaps a capacitance former 234 does not have a meandering shape and the third metal film constituent 230B does not have a portion that overlaps a second output line 233B. The third metal film constituent 230B has a substantially square portion that overlaps an end of the capacitance former 234 that faces the output transistor 232, and this portion is connected to a second electrode 234B. As shown in FIG. 16, a first interlayer insulating film 224, a planarizing film 225, and a second interlayer insulating film 227, which are sandwiched between the third metal film constituent 230B and the second electrode 234B, have a capacitance former contact hole CH12 bored therethrough in such a place as to overlap both the third metal film constituent 230B and the second electrode 234B. The third metal film constituent 230B and the second electrode 234B are connected to each other through the capacitance former contact hole CH12. Such a configuration reduces the creeping distance of the connecting line 230 as compared with Embodiment 1. This is suitable for a case where a time constant pertaining to the transmission characteristics of a signal that is transmitted by the connecting line 230 does not need to be made larger than in Embodiment 1.

According to the present embodiment, as described above, the gate circuit section 215 includes a capacitance former 234 as the circuit element, the capacitance former 234 has a first electrode 234A and a second electrode 234B that overlap each other via a gate insulating film (insulating film) 221, the output transistor 232 has a gate electrode 232A connected to either of the first electrode 234A and the second electrode 234B, the signal outputter 233 is connected to the other of the first electrode 234A and the second electrode 234B, and the connecting line 230 is connected to the signal outputter 233 in such a place as to overlap a portion of the capacitance former 234. In this way, the capacitance former 234 causes the electric potential of the gate electrode 232A of the output transistor 232 to be bootstrapped via a capacitance formed by the capacitance former 234 to a higher potential than the signal outputted from the output transistor 232. This makes it possible to increase the amount of electric current between the source electrode 232B and the drain electrode 232C of the output transistor 232, making more certain that the signal is stably supplied to the gate line 213. The connecting line 230 is connected to the signal outputter 233 in such a place as to overlap a portion of the capacitance former 234, so that the place of connection of the connecting line 230 to the signal outputter 233 can be adjusted within a range of the capacitance former 234. This makes it possible to more appropriately adjust a time constant pertaining to the transmission characteristics of a signal that is transmitted by the connecting line 230.

Embodiment 4

Embodiment 4 of the present invention is described with reference to FIGS. 17 to 21. Embodiment 4 illustrates changes made from Embodiment 1 to achieve, for example, the outer shapes of a liquid crystal panel 310 and an array substrate 310A. It should be noted that a repeated description of structures, workings, and effects which are similar to those of Embodiment 1 is omitted.

Figure 17:
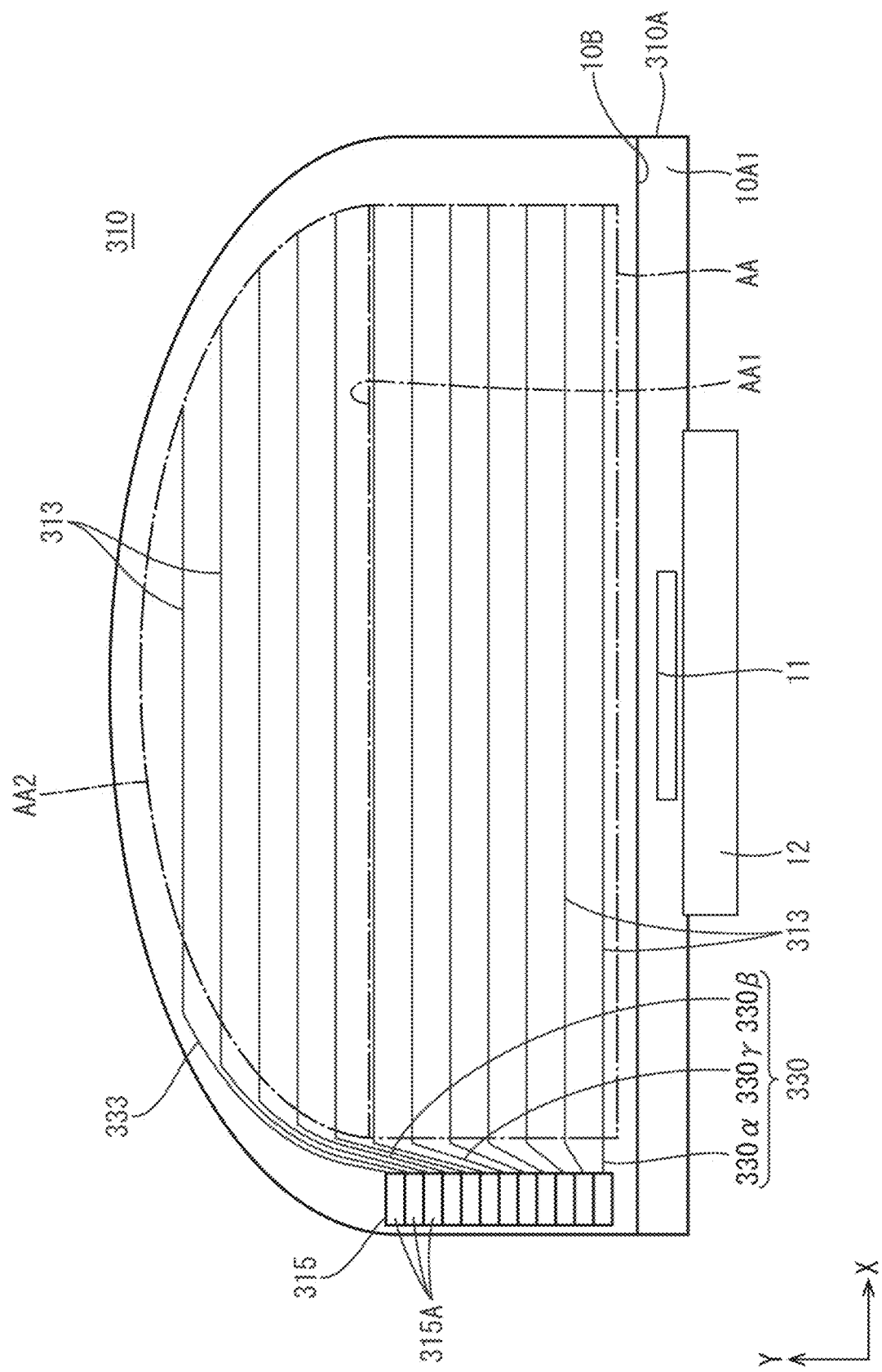
FIG. 17 is a schematic plan view of a liquid crystal panel according to Embodiment 4 of the present invention.

As shown in FIG. 17, the liquid crystal panel 310 and the array substrate 310A according to the present embodiment have a wholly horizontally long planar shape formed by combining an oblong shape with a semielliptical shape, and is shaped such that while a pair of short sides linearly extend parallel to the Y-axis direction and one long side linearly extends parallel to the X-axis direction, the other long side is curved in the form of an arc in plan view. In conformance with the outer shapes of the liquid crystal panel 310 and the array substrate 310A, the outer shape of the display area AA, too, has a horizontally long planar shape formed by combining an oblong shape with a semielliptical shape. In particular, the display area AA includes a first area AA1 that has a linear outer shape along the Y-axis direction and a second area AA2, located at an end of the first area AA1 in the Y-axis direction, that has a substantially arc (nonlinear) outer shape. Meanwhile, a gate circuit section 315 is located closer to the center than to the second area AA2 in the Y-axis direction. That is, the gate circuit section 315 is disposed adjacent to the first area AA1 in the X-axis direction, and is configured not to include a unit circuit component 315A offset toward the second area AA2 in the Y-axis direction from the first area AA1. Accordingly, the gate circuit section 315 is constituted by a plurality of unit circuit components 315A whose range of formation in the Y-axis direction falls within the range of formation of the first area AA1 in the Y-axis direction. The plurality of unit circuit components 315A are linearly arranged along the outer shape (Y-axis direction) of the first area AA1, and are placed at a certain width of spacing from the first area AA1. In this way, the gate circuit section 315 according to the present embodiment has its plurality of unit circuit components 315A arrayed at spacings which are smaller than those at which gate lines 313 are arrayed, as the range of formation of the gate circuit section 315 in the Y-axis direction is narrower than the range of formation of the display area AA in the Y-axis direction. In the present embodiment, the gate circuit section 315 is disposed only at one side (left in FIG. 17) of the display area AA in the X-axis direction.

In the present embodiment, in which the range of formation of the gate circuit 315 in the Y-axis direction is narrower than the range of formation of the display area AA in the Y-axis direction, the plurality of unit circuit components 315A constituting the gate circuit section 315 vary in creeping distance from ends thereof that face the display area AA to the gate lines 313 to which they are connected, so that a unit circuit component 315 located in a higher position in FIG. 17 tends to have a longer creeping distance and, on the other hand, a unit circuit component 315 located in a lower position in FIG. 17 tends to have a shorter creeping distance. For this reason, there occur variations in interconnection resistance due to the aforementioned variations in creeping distance on transmission paths of scanning signals from the unit circuit components 315A to the gate lines 313.

Figure 18:
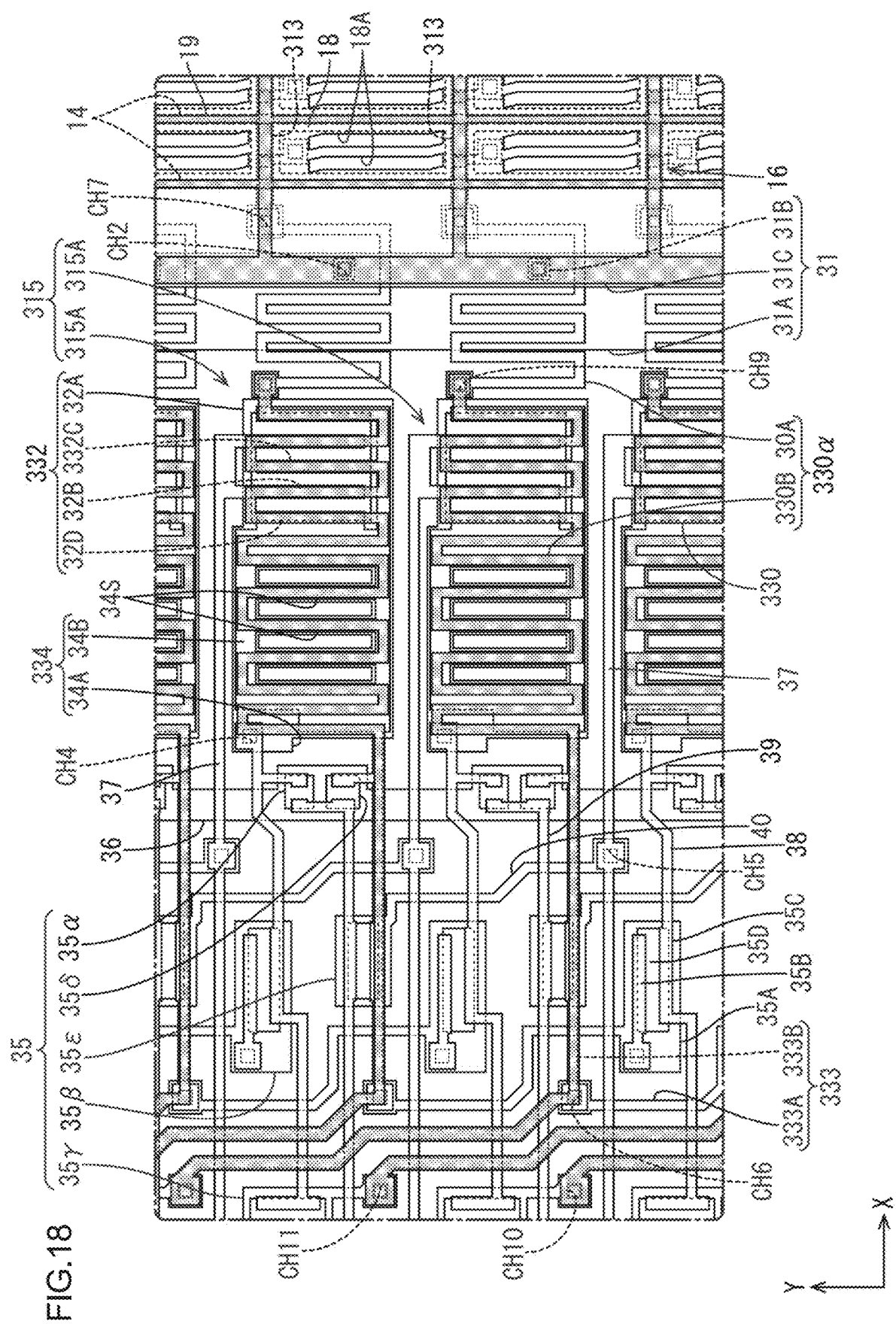
FIG. 18 is a plan view mainly showing a pattern of a third metal film for a first connecting line connected to a unit circuit component constituting a gate circuit section.
Figure 19:
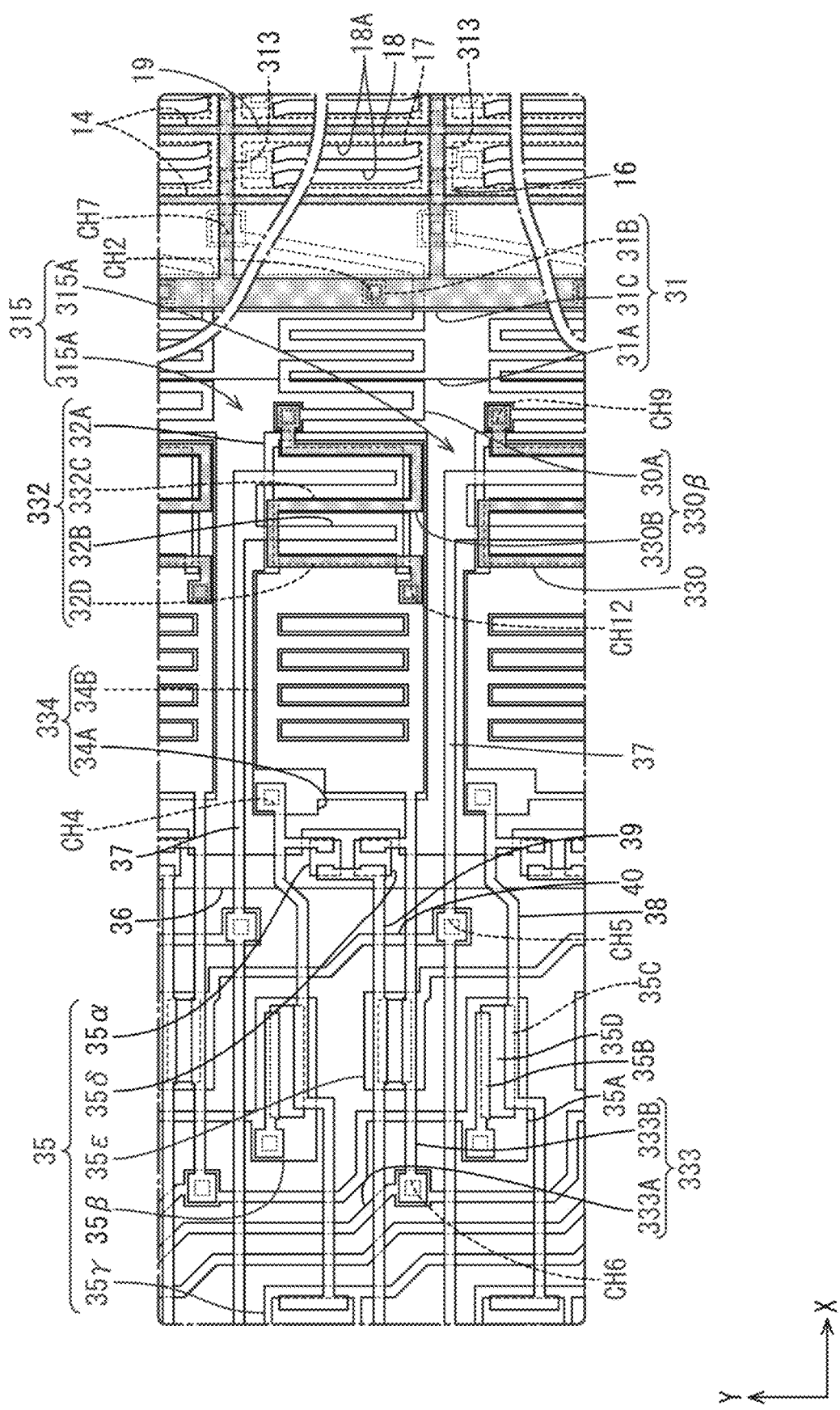
FIG. 19 is a plan view mainly showing a pattern of the third metal film for a second connecting line connected to the unit circuit component.
Figure 20:
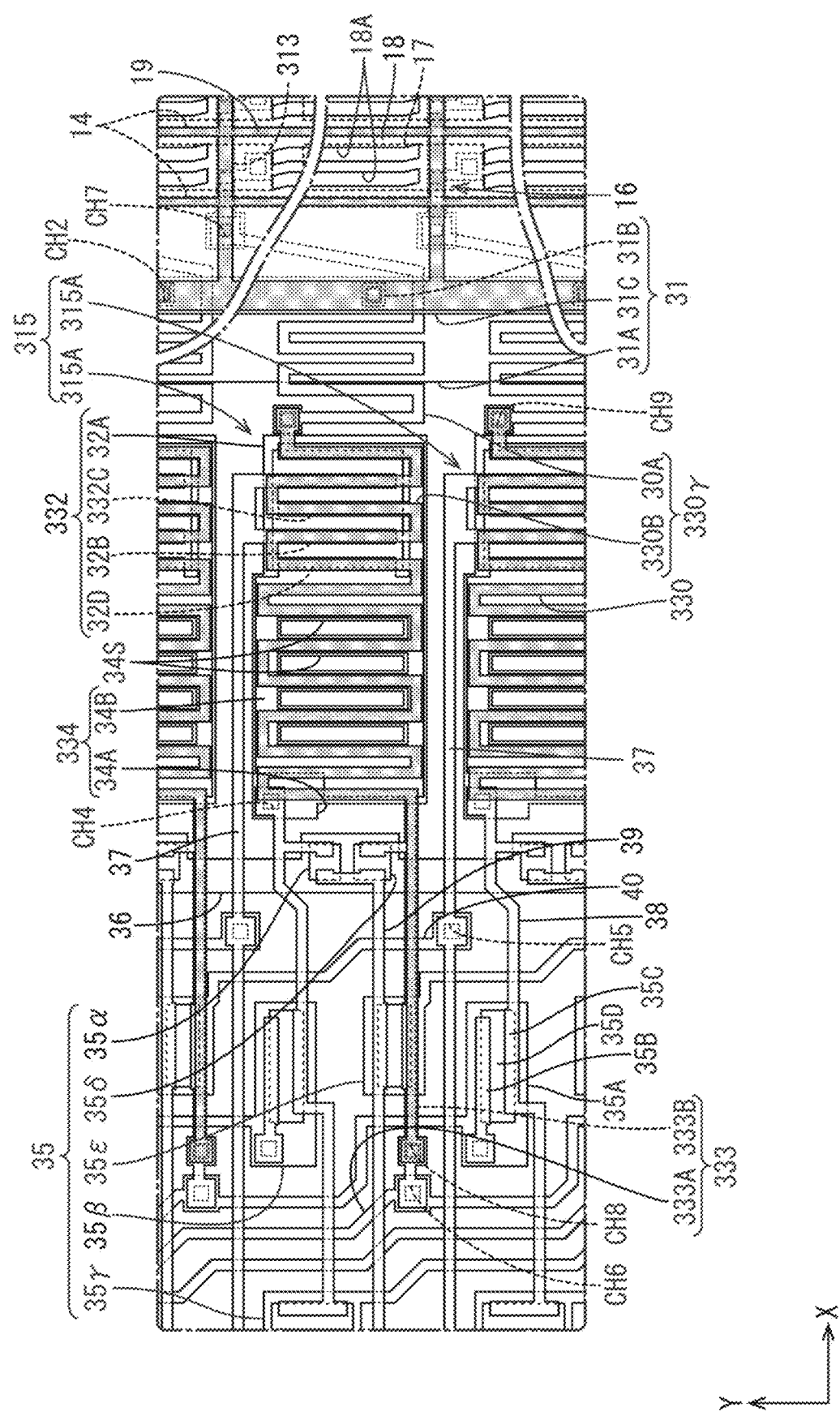
FIG. 20 is a plan view mainly showing a pattern of the third metal film for a third connecting line connected to the unit circuit component.

Meanwhile, in the present embodiment, as shown in FIGS. 18 to 20, places of connection of a plurality of connecting lines 330 to the unit circuit components 315A vary according to the unit circuit components 315A and the gate lines 313 to which the plurality of connecting lines 330 are connected. FIGS. 18 to 20 are enlarged plan views mainly showing patterns of a third metal film for a configuration of the gate circuit section 315 and its surroundings, and apply half-tone dot meshing to the third metal film. That is, as shown in FIGS. 18 and 19, the plurality of connecting lines 330 include at least first connecting lines 330α connected to a subset of gate lines 313 disposed in the first area AA1 and second connecting lines 330β connected to a subset of gate lines 313 disposed in the second area AA2. Among these, the second connecting lines 330β are configured so that the places of connection of the second connecting lines 330β to corresponding ones of the unit circuit components 315A are closer to the display area AA than the places of connection of the first connecting lines 330α to corresponding ones of the unit circuit components 315A. Specifically, as shown in FIG. 18, each of the first connecting lines 330α includes a third metal film constituent 330B that runs parallel to and overlaps a first output line 333A of a signal outputter 333, that extends along the Y-axis direction while passing transversely across the immediately preceding unit circuit component 315A, and that is connected to the first output line 333A in a place offset in the Y-axis direction from the unit circuit component 315A to which the first connecting line 330α is connected. That is, the first connecting line 330α is similar in configuration to the connecting line 130 (see FIG. 13) described above in Embodiment 2, and is longest in creeping distance from the place of connection of the first connecting line 330α to the unit circuit component 315A to an end of the unit circuit component 315A that faces the display area AA. Meanwhile, as shown in FIG. 19, each of the second connecting lines 330β includes a third metal film constituent 330B connected to a signal outputter 233 in such a place as to overlap a portion of a capacitance former 334. The third metal film constituent 330B of the second connecting line 330β is configured such that a portion of the third metal film constituent 330B that overlaps the capacitance former 334 does not have a meandering shape and the third metal film constituent 330B does not have a portion that overlaps a second output line 330B. That is, the second connecting line 330β is similar in configuration to the connecting line 230 (see FIG. 15) described above in Embodiment 3, and is shortest in creeping distance from the place of connection of the second connecting line 330β to the unit circuit component 315A to an end of the unit circuit component 315A that faces the display area AA. Because of such a configuration in which the places of connection of the second connecting lines 330β to the corresponding unit circuit components 315A are closer to the display area AA than the places of connection of the first connecting lines 330α to the corresponding unit circuit components 315A, the first connecting lines 330α and the second connecting lines 330β differ less from each other in creeping distance from the places of connection to the unit circuit components 315A to the gate lines 313.

Figure 21:
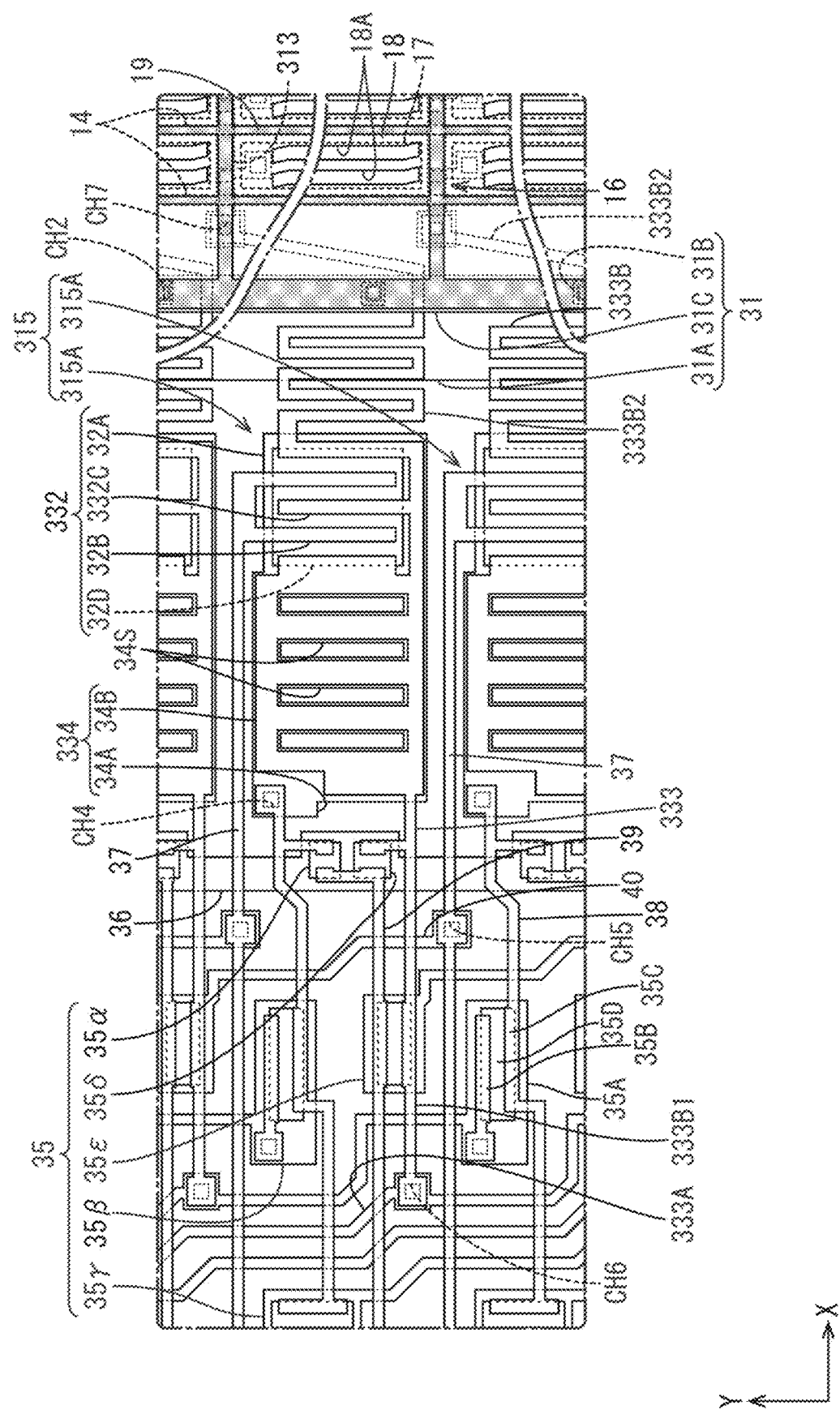
FIG. 21 is a plan view mainly showing a pattern of the third metal film for a unit circuit component whose signal outputter is connected directly to a gate line.

Furthermore, as shown in FIG. 20, the plurality of connecting lines 330 include third connecting lines 330γ connected to gate lines 313 located closer to the second area AA1 (up in FIG. 20) than the gate lines 313 disposed in the first area AA1 and connected to the first connecting lines 330α. The third connecting lines 330γ are configured such that the places of connection of the third connecting lines 330γ to corresponding ones of the unit circuit components 315A are closer to the display area AA than the places of connection of the first connecting lines 330α to the corresponding unit circuit components 315A but are farther away from the display area AA than the places of connection of the second connecting lines 330β to the corresponding unit circuit components 315A. Specifically, each of the third connecting lines 330γ includes a third metal film constituent 330B connected to a second output line 333B in a place located at a side of a point of connection (output line contact hole CH6) between a first output line 333A and the second output line 333B that faces the display area AA in the X-axis direction. That is, the third connecting line 330γ is similar in configuration to the connecting line 30 (see FIG. 9) described above in Embodiment 1, and is shorter than the first connecting line 330α but longer than the second connecting line 330β in creeping distance from the place of connection to the unit circuit component 315A to an end of the unit circuit component 315A that faces the display area AA. Further, as shown in FIG. 21, a gate line 313 located at an end side (side opposite to the first area AA1, up in FIG. 17) in the Y-axis direction with respect to the gate lines 313 disposed in the second area AA2 and connected to the second connecting lines 330β is connected directly to the signal outputter 333 of a unit circuit component 315A without a connecting line 330. FIG. 21 is a plan view mainly showing a pattern of the third metal film for the configuration of the gate circuit section 315 and its surroundings, and applies half-tone dot meshing to the third metal film. This signal outputter 333 includes two second output lines 333B, namely a second output line 333B1 and a second output line 333B2. While the second output line 333B1 is similar in configuration to its counterpart described above in Embodiment 1, the second output line 333B2 is joined directly to a drain electrode 332C of an output transistor 332. The second output line 333B2 extends along the outer shape of the second area AA2 from the drain electrode 332C of the output transistor 332 (i.e. an end of the unit circuit component 315A that faces the display area AA) to an end of the gate line 313.

As noted above, as shown in FIGS. 18 to 21, the plurality of connecting lines 330 are configured such that a creeping distance from an end of the unit circuit component 315A that faces the display area AA to the place of connection of the connecting line 330 to the unit circuit component 315A is inversely correlated with a creeping distance from the end of the unit circuit component 315A that faces the display area AA to the gate line 313. In this way, the plurality of connecting lines 330 differ more suitably less from each other in creeping distance from the places of connection to the unit circuit components 315A to the gate lines 313.

According to the present embodiment, as described above, a plurality of the gate lines 313 are arranged side by side in the display area AA along a cross direction crossing a direction of arrangement of the gate circuit section 315 and the display area AA, the gate circuit section 315 includes a plurality of unit circuit components 315A each provided with the circuit element and arranged side by side along the cross direction, a plurality of the connecting lines 330 are individually connected to the plurality of gate lines 313 and the plurality of unit circuit components 315A, the display area AA includes a first area AA1 whose outer shape has a side extending along the cross direction and a second area AA2, located at an end of the first area AA1 in the cross-direction, that has an outer shape which is different from that of the first area AA1, the gate circuit section 315 is located closer to the first area AA1 than to the second area AA2 in the cross direction, and a plurality of the connecting lines 330 include a first connecting line 330α connected to the gate line 313 disposed in the first area AA1 and a second connecting line 330β that is connected to the gate line 313 disposed in the second area AA2 and that is configured such that a place of connection of the second connecting line 330β to the unit circuit component 315A is closer to the display area AA than a place of connection of the first connecting line 330α to the unit circuit component 315A. In this way, the signals outputted from the respective signal outputters 333 of the plurality of unit circuit components 315A are individually supplied via the plurality of connecting lines 330 to the plurality of gate lines 313. Since the gate circuit section 315 is located closer to the first area AA1 than to the second area AA, which has an outer shape which is different in from that of the first area AA1, in the cross direction, the plurality of unit circuit components 315A can be regularly arrayed along a side of the first region AA1 that extends along the cross direction. This makes it easy to stabilize the operation of the plurality of unit circuit components 315A and makes it easy to design a circuit configuration of each of the unit circuit components 315A. As compared with the first connecting line 330α connected to the gate line 313 disposed in the first area AA1, the second connecting line 330β connected to the gate line 313 disposed in the second area AA2 tends to longer in creeping distance from the end of the gate circuit section 315 that faces the display area AA to the gate line 313. On the other hand, because of the configuration in which the places of connection of the second connecting lines 330β to the corresponding unit circuit components 315A are closer to the display area AA than the places of connection of the first connecting lines 330α to the corresponding unit circuit components 315A, the first connecting lines 330α and the second connecting lines 330β differ less from each other in creeping distance from the places of connection to the unit circuit components 315A to the gate lines 313.

Further, the plurality of connecting lines 330 are configured such that a creeping distance from an end of the unit circuit component 315A that faces the display area AA to a place of connection of the connecting line 330 to the unit circuit component 315A is inversely correlated with a creeping distance from the end of the unit circuit component 315A that faces the display area AA to the gate line 313. In this way, the plurality of connecting lines 330 differ more suitably less from each other in creeping distance from the places of connection to the unit circuit components 315A to the gate lines 313.

Embodiment 5

Embodiment 5 of the present invention is described with reference to FIG. 22. Embodiment 5 illustrates an array substrate 51 of an organic EL display panel (organic EL display device) 50. It should be noted that a repeated description of structures, workings, and effects which are similar to those of Embodiment 1 is omitted.

Figure 22:
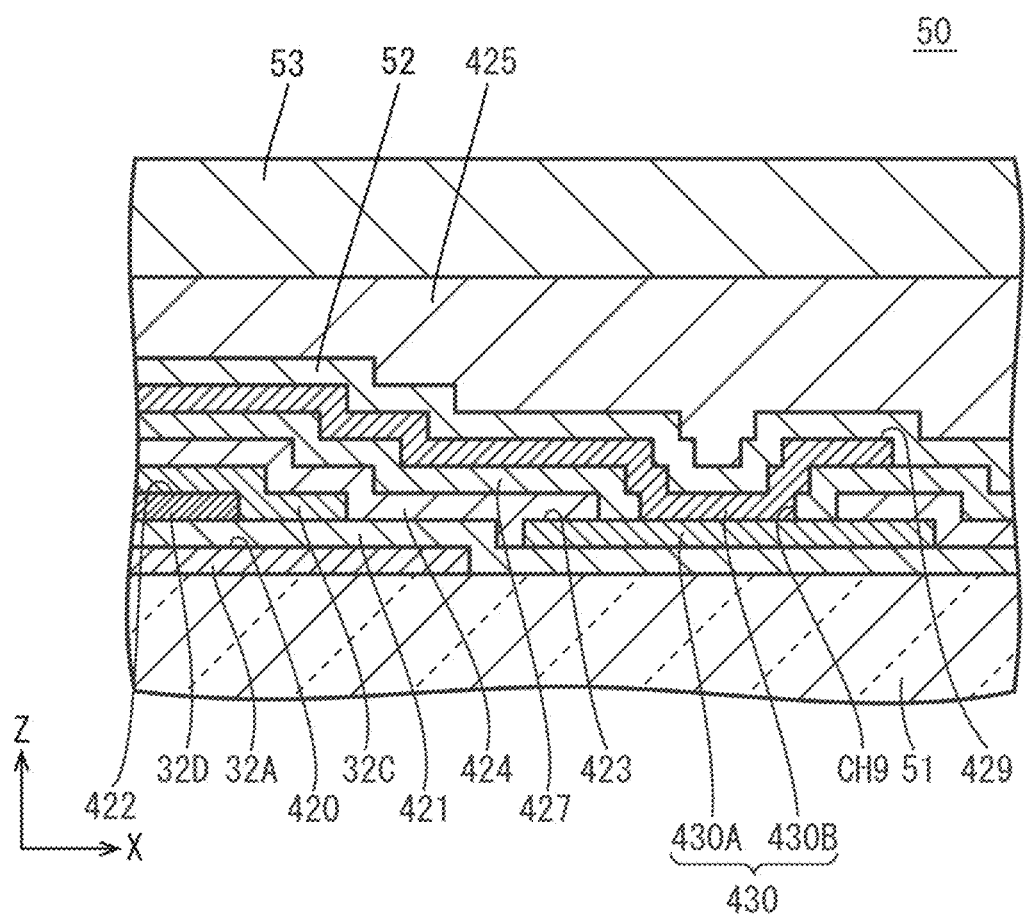
FIG. 22 is a cross-sectional view of a point of connection between a second metal film constituent and a third metal film constituent constituting a connecting line over an array substrate constituting an organic EL display panel according to Embodiment 5 of the present invention and an area around the point of connection.

As shown in FIG. 22, the organic EL display panel 50 according to the present embodiment includes the array substrate 51, to which various types of line and the like are connected. FIG. 22 is a cross-sectional view of a point of connection between a second metal film constituent 430A and a third metal film constituent 430B constituting a connecting line 430 over the array substrate 51 and an area around the point of connection. In the present embodiment, an organic EL device layer (light-emitting section), a cathode electrode layer, a sealing layer, and the like are stacked over the array substrate 51. The organic EL device layer is a known component composed of a hole injection layer, a hole transport layer, an electron injection layer, an electron transport layer, a light-emitting layer, and the like. The light-emitting layer is sandwiched between the hole transport layer and the electron transport layer, and emits light by excitation of a light-emitting substance contained in the light-emitting layer by energy generated by the binding of holes and electrons in the light-emitting layer. Light emitted by the light-emitting layer is emitted toward a side opposite to the array substrate 51 in the Z-axis direction (thickness direction). That is, the organic EL display panel 50 according to the present invention is of a so-called top emission type.

Films are stacked over the array substrate 51 in the following manner. As shown in FIG. 22, the array substrate 51 is the same as the array substrate 10A (see FIG. 12) constituting the liquid crystal panel 10 described above in Embodiment 1 in that the array substrate 51 includes a first metal film 420, a gate insulating film 421, a semiconductor film 422, a second metal film 423, and a first interlayer insulating film 424. On the other hand, the array substrate 51 according to the present embodiment is different from Embodiment 1 in that the array substrate 51 includes a second interlayer insulating film 427 disposed at a lower level than a third metal film 429 and at a higher level than the first interlayer insulating film 424 and a planarizing film 425 disposed at a higher level than the third metal film 429. Furthermore, the array substrate 51 according to the present embodiment is different from Embodiment 1 in that the array substrate 51 includes a third interlayer insulating film 52 disposed at a higher level than the third metal film 429 and at a lower level than the planarizing film 425 and a protective film 53 disposed at a higher level than the planarizing film 425. The third interlayer insulating film 52 is made of an inorganic material as is the case with the gate insulating film 421, the first interlayer insulating film 424, and the second interlayer insulating film 427. The protective film 53 is made of an organic material such as polyimide. Further, the planarizing film 425 according to the present embodiment is made of polyimide as is the case with the protective film 53, and is different in material from the planarizing film 25 described above in Embodiment 1. Such a configuration, too, brings about workings and effects which are similar to those of Embodiment 1.

Other Embodiments

The present invention is not limited to the embodiments described with reference to the foregoing description and drawings; for example, the following embodiments are encompassed in the technical scope of the present invention, too.

(1) The specific circuit configuration of the unit circuit component 15A, 115A, or 315A is subject to change as appropriate. For example, a circuit element other than the output transistor 32, 132, 232, or 332, the capacitance former 34, 134, 234, or 334, and the control transistor 35 or 135 may be added. Further, it is also possible to change the numbers of capacitance formers 34, 134, 234, or 334 and control transistors 35 or 135 provided. Further, it is also possible to change the placement of circuit elements such as the output transistor 32, 132, 232, or 332, the capacitance former 34, 134, 234, or 334, and the control transistor 35 or 135. Further, the first output line 33A, 133A, or 333A, which constitutes the signal outputter 33, 133, 233, or 333, may be connected to the unit circuit component 15A, 115A, or 315A immediately preceding the unit circuit component 15A, 115A, or 315A to which the first output line 33A, 133A, or 333A is connected, or may be connected to the unit circuit component 15A, 115A, or 315A immediately subsequent to the unit circuit component 15A, 115A, or 315A to which the first output line 33A, 133A, or 333A is connected. Further, the first output line 33A, 133A, or 333A, which constitutes the signal outputter 33, 133, 233, or 333, may be connected to the unit circuit component 15A, 115A, or 315A immediately preceding but two or more the unit circuit component 15A, 115A, or 315A to which the first output line 33A, 133A, or 333A is connected, or may be connected to the unit circuit component 15A, 115A, or 315A immediately subsequent but two or more to the unit circuit component 15A, 115A, or 315A to which the first output line 33A, 133A, or 333A is connected.

(2) The second transparent electrode film may be stacked at a higher level than the third metal film constituent 30B, 130B, 230B, 330B, or 430B of the connecting line 30, 130, 230, 330, or 430.

(3) The specific place of connection of the connecting line 30, 130, 230, 330, or 430 to the signal outputter 33, 133, 233, or 333 is subject to change as appropriate.

(4) The specific path of routing of the third metal film constituent 30B, 130B, 230B, 330B, or 430B of the connecting line 30, 130, 230, 330, or 430 is subject to change as appropriate. Similarly, the specific path of routing of the second metal film constituent 30A or 430A is subject to change as appropriate, too. Further, the specific place of connection between the second metal film constituent 30A or 430A and the third metal film constituent 30B, 130B, 230B, 330B, or 430B is subject to change as appropriate, too.

(5) The third metal film 29, 129, 229, or 429, which constitutes the third metal film constituent 30B, 130B, 230B, 330B, or 430B of the connecting line 30, 130, 230, 330, or 430, may be disposed at a lower level than the first metal film 20 or 42 via an insulating layer. Alternatively, the third metal film 29, 129, 229, or 429 may be disposed at a higher level than the first metal film 20 or 420 via an insulating film and at a lower level than the second metal film 23, 123, or 423 via an insulating film.

(6) The connecting line 30, 130, 230, 330, or 430 may be constituted solely by the third metal film constituent 30B, 130B, 230B, 330B, or 430B composed of the third metal film 29, 129, 229, or 429. In that case, it is preferable that the common trunk line 31 be configured not to include the third trunk line constituent 31C.

(7) The signal outputter 33, 133, 233, or 333 may be constituted solely by the first output line 33A, 133A, or 333A composed of the first metal film 20 or 420, or may be constituted solely by the second output line 33B, 133B, 233B, or 333B composed of the second metal film 23, 123, or 423.

(8) It is also possible not to form the slits 34A in the capacitance former 34, 134, 234, or 334. In this case, it is preferable that the seal 10D be configured to be disposed not to overlap the capacitance former 34, 134, 234, or 334 or the seal 10D be configured to be made of a thermosetting resin material or the like.

(9) The connecting line 330 may include a fourth connecting line in addition to the first connecting line 330α, the second connecting line 330β, and the third connecting line 330γ. The fourth connecting line may be shorter than the first connecting line 330α but longer than the third connecting line 330γ in creeping distance from the place of connection to the unit circuit component 315A to an end of the unit circuit component 315A that faces the display area AA. Further, the fourth connecting line may be shorter than the third connecting line 330γ but longer than the second connecting line 330β in creeping distance from the place of connection to the unit circuit component 315A to the end of the unit circuit component 315A that faces the display area AA.

(10) It is also possible to change the order in which the second transparent electrode film 28 and the third metal film 29, 129, 229, or 429 are stacked.

(11) The spacings between which the plurality of unit circuit components 15A, 115A, or 315A of the gate circuit section 15, 115, 215, or 315 are arrayed and the spacings between which the gate lines 13, 113, 213, or 313 (pixel electrodes 17) are arrayed are subject to change as appropriate.

(12) The specific outer shapes of the liquid crystal panel 10 or 310 and the array substrate 10A or 310A and the specific outer shape of the display area AA are subject to change as appropriate. For example, a shape formed with a resolution of an arrangement of two or more (e.g. four) FHD (full high-definition) displays in landscape orientation may be adopted, or a shape formed by combining a rectangle with a trapezoid or a triangle in plan view may be adopted.

(13) The specific planar shape and number of pixel electrode overlap openings 18A provided in the common electrode 18 are subject to change as appropriate.

(14) The pixel electrode overlap openings 18A provided in the common electrode 18 may be omitted and replaced by openings bored through the pixel electrode 17.

(15) Alternatively, the pixel electrode 17 may be constituted by the second transparent electrode film 28, and the common electrode 18 may be constituted by the first transparent electrode film 26.

(16) The display mode of the liquid crystal panel 10 or 310 may be a TN mode, a VA mode, an IPS mode, or other modes instead of being an FFS mode.

(17) The liquid crystal panel 10 or 310 may be of a reflective type or a semi-transmissive type instead of being of a transmissive type.

(18) Alternatively, the semiconductor film 22 may be made of amorphous silicon or polysilicon (LIPS).

(19) The liquid crystal panel 10 or 310 or the organic EL display panel 50 may be replaced by another type of display device.

REFERENCE SIGNS LIST 10, 310 liquid crystal panel (display device)
10A, 51, 310A array substrate (substrate for display device)
10B CF substrate (counter substrate)
10C liquid crystal layer
10D seal
13, 113, 213, 313 gate line (display line)
15, 115, 215, 315 gate circuit section (signal supply circuit section)
15A, 115A, 315A unit circuit component
20, 420 first metal film (first conducing film)
21, 121, 221, 421 gate insulating film (insulating film)
23, 123, 423 second metal film (second conducing film)
24, 124, 224, 424 first interlayer insulating film (insulating film)
25, 125, 225, 425 planarizing film (insulating film)
27, 127, 227, 427 second interlayer insulating film (insulating film)
29, 129, 229, 429 third metal film (third conducing film)
30, 130, 230, 330, 430 connecting line
30A, 430A second metal film constituent
30B, 130B, 230B, 330B, 430B third metal film constituent
31C third trunk line constituent (line)
32, 132, 232, 332 output transistor
32A, 232A gate electrode
33, 133, 233, 333 signal outputter
33B, 133B, 233B, 333B second output line (output line)
34, 134, 234, 334 capacitance former (seal overlap portion)
34A, 234A first electrode
34B, 234B second electrode
34S slit
35, 135 control transistor
330α first connecting line
330β second connecting line
50 organic EL display panel (display device)
AA display area
AA1 first area
AA2 second area

The invention claimed is:

1. A substrate for a display device, the substrate comprising:
a display area capable of displaying an image;
a signal supply circuit section, disposed closer to an end than the display area, that has a circuit element including at least a first conducting film and a second conducting film with an insulating layer sandwiched between the first conducting film and the second conducting film;
a display line disposed in the display area, composed of the first conducting film or the second conducting film, and supplied with a signal by the signal supply circuit section; and
a connecting line connected to the display line and the signal supply circuit section,
wherein at least a portion of the connecting line is constituted by a third conducting film with insulating films sandwiched between the first conducting film and the third conducting film and between the second conducting film and the third conducting film.

2. A substrate according to claim 1, wherein the connecting line is connected to the signal supply circuit section in a place located at a side of an end of the signal supply circuit section that faces the display area opposite to the display area.

3. A substrate according to claim 2, wherein
the signal supply circuit section includes
an output transistor that outputs the signal as the circuit element, and
a signal outputter, connected to the output transistor and the connecting line, that transmits to the connecting line the signal outputted from the output transistor, and
the connecting line is connected to the signal outputter in a place located at a side of the output transistor opposite to the display area, and is disposed so as to pass transversely across the output transistor.

4. A substrate according to claim 3, wherein
the signal supply circuit section includes a capacitance former disposed as the circuit element at a side of the output transistor opposite to the display area,
the capacitance former has a first electrode and a second electrode that overlap each other via an insulating film,
the output transistor has a gate electrode connected to either of the first electrode and the second electrode,
the signal outputter is connected to the other of the first electrode and the second electrode, and
the connecting line is connected to the signal outputter in a place located at a side of the capacitance former opposite to the output transistor, and is disposed so as to pass transversely across the capacitance former.

5. A substrate according to claim 4, wherein
the signal supply circuit section includes a control transistor disposed as the circuit element at a side of the capacitance former opposite to the output transistor, and
the connecting line is connected to the signal outputter in a place located at a side of the control transistor opposite to the display area, and is disposed so as to pass transversely across the control transistor.

6. A substrate according to claim 5, wherein
the signal outputter includes an output line connected to at least the capacitance former and the control transistor and composed of the first conducting film or the second conducting film, and
the connecting line is connected to the output line and disposed so as to overlap the output line.

7. A substrate according to claim 3, wherein
the signal supply circuit section includes a capacitance former as the circuit element,
the capacitance former has a first electrode and a second electrode that overlap each other via an insulating film,
the output transistor has a gate electrode connected to either of the first electrode and the second electrode,
the signal outputter is connected to the other of the first electrode and the second electrode, and
the connecting line is connected to the signal outputter in such a place as to overlap a portion of the capacitance former.

8. A substrate according to claim 2, wherein
a plurality of the display lines are arranged side by side in the display area along a cross direction crossing a direction of arrangement of the signal supply circuit section and the display area,
the signal supply circuit section includes a plurality of unit circuit components each provided with the circuit element and arranged side by side along the cross direction,
a plurality of the connecting lines are individually connected to the plurality of display lines and the plurality of unit circuit components,
the plurality of unit circuit components each has a signal outputter, connected to the connecting line, that outputs the signal to the connecting line,
at least a portion of the signal outputter extends along the cross direction so as to pass transversely across the unit circuit component adjacent in the cross direction,
the connecting line is connected to the signal outputter in a place offset in the cross direction from the unit circuit component to which the connecting line is connected, and is disposed so as to pass transversely across the unit circuit component adjacent to the unit circuit component to which the connecting line is connected.

9. A substrate according to claim 1, wherein
the display line is composed of the first conducting film, and
the connecting line is constituted by a second conducting film constituent composed of the second conducting film and connected to the display line and a third conducting film constituent composed of the third conducting film and connected to the signal supply circuit section.

10. A substrate according to claim 9, further comprising a line extended along a cross direction crossing a direction of arrangement of the signal supply circuit section and the display area, located between the display area and the signal supply circuit section, and composed of the third conducting film,
wherein the connecting line is disposed so that the second conducting film constituent passes transversely across the line.

11. A substrate according to claim 1, wherein
a plurality of the display lines are arranged side by side in the display area along a cross direction crossing a direction of arrangement of the signal supply circuit section and the display area,
the signal supply circuit section includes a plurality of unit circuit components each provided with the circuit element and arranged side by side along the cross direction,
a plurality of the connecting lines are individually connected to the plurality of display lines and the plurality of unit circuit components, and
the connecting line is connected to the display line by extending so as to repeatedly meander within a range of the unit circuit component to which the connecting line is connected.

12. A substrate according to claim 1, wherein
a plurality of the display lines are arranged side by side in the display area along a cross direction crossing a direction of arrangement of the signal supply circuit section and the display area,
the signal supply circuit section includes a plurality of unit circuit components each provided with the circuit element and arranged side by side along the cross direction,
a plurality of the connecting lines are individually connected to the plurality of display lines and the plurality of unit circuit components,
the display area includes a first area whose outer shape has a side extending along the cross direction and a second area, located at an end of the first area in the cross-direction, that has an outer shape which is different from that of the first area,
the signal supply circuit section is located closer to the first area than to the second area in the cross direction, and
a plurality of the connecting lines include a first connecting line connected to the display line disposed in the first area and a second connecting line that is connected to the display line disposed in the second area and that is configured such that a place of connection of the second connecting line to the unit circuit component is closer to the display area than a place of connection of the first connecting line to the unit circuit component.

13. A substrate according to claim 12, wherein the plurality of connecting lines are configured such that a creeping distance from an end of the unit circuit component that faces the display area to a place of connection of the connecting line to the unit circuit component is inversely correlated with a creeping distance from the end of the unit circuit component that faces the display area to the display line.

14. A display device comprising:
A substrate according to claim 1; and
a counter substrate placed opposite the substrate.

15. The display device according to claim 14, further comprising:
a liquid crystal layer sandwiched between the substrate and the counter substrate; and
a seal sandwiched between the substrate and the counter substrate, disposed so as to surround the liquid crystal layer, and made of a photo-curing resin material,
wherein at least a portion of the signal supply circuit section serves as a seal overlap portion disposed so as to overlap the seal,
the overlap portion has a slit, bored therethrough, through which to transmit light, and
the connecting line is disposed in such a manner as to circumvent the slit so as not to overlap the slit.

* * * * *